(12) United States Patent
Yoon et al.

(10) Patent No.: US 12,494,352 B2
(45) Date of Patent: Dec. 9, 2025

(54) PLASMA CONFINEMENT RING, SEMICONDUCTOR MANUFACTURING APPARATUS INCLUDING THE SAME, AND METHOD OF MANUFACTURING A SEMICONDUCTOR DEVICE USING THE SAME

(71) Applicant: SAMSUNG ELECTRONICS CO., LTD., Suwon-si (KR)

(72) Inventors: Kuihyun Yoon, Yongin-si (KR); Sang Ki Nam, Seongnam-si (KR); Kwonsang Seo, Suwon-si (KR); Sungho Jang, Hwaseong-si (KR); Jungmin Ko, Seoul (KR); Nam Kyun Kim, Pyeongtaek-si (KR); Tae-Hyun Kim, Suwon-si (KR); Seunghan Baek, Busan (KR); Seungbin Ahn, Incheon (KR); Jungmo Yang, Pyeongtaek-si (KR); Changheon Lee, Seongnam-si (KR); Kangmin Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/548,775

(22) Filed: Dec. 13, 2021

(65) Prior Publication Data
US 2022/0351947 A1  Nov. 3, 2022

(30) Foreign Application Priority Data
Apr. 29, 2021 (KR) .................. 10-2021-0055971

(51) Int. Cl.
*H01J 37/32* (2006.01)
*H01L 21/3065* (2006.01)

(52) U.S. Cl.
CPC .... *H01J 37/32642* (2013.01); *H01L 21/3065* (2013.01)

(58) Field of Classification Search
CPC .............. H01J 37/32091; H01J 37/321; H01J 37/3244; H01J 37/32449; H01J 37/32495;
(Continued)

(56) References Cited

U.S. PATENT DOCUMENTS 6,093,281 A * 7/2000 Wise .................. C23C 16/4412
                                                118/723 MW
6,733,620 B1 * 5/2004 Sugiyama ......... H01J 37/32834
                                                118/715
(Continued)

FOREIGN PATENT DOCUMENTS

JP  2004-200460 A  7/2004
KR  10-0603682 B1  7/2006
(Continued)

*Primary Examiner* — Gordon Baldwin
*Assistant Examiner* — Joshua Reyes
(74) *Attorney, Agent, or Firm* — Sughrue Mion, PLLC

(57) ABSTRACT

A plasma confinement ring includes a lower ring, an upper ring on the lower ring, and a connection ring extended to connect the lower ring to the upper ring. The lower ring includes a lower center hole vertically penetrating the lower ring at a center of the lower ring and at least one slit penetrating the lower ring in a region outside the lower center hole. The slit is structured to pass a more amount of air or gas at a first portion closer to the center of the lower ring than at a second portion farther from the center of the lower ring.

15 Claims, 17 Drawing Sheets

(58) Field of Classification Search
CPC .......... H01J 37/32623; H01J 37/32633; H01J 37/32642; H01J 37/32651; H01L 21/3065; H01L 21/67063; H01L 21/67069; H01L 21/6833; H01L 21/68735; H01L 21/68785; C23C 16/245; C23C 16/45502; C23C 16/45587; C23C 16/45591; C23C 16/4585
See application file for complete search history.

(56) References Cited

U.S. PATENT DOCUMENTS

| | | | |
|---|---|---|---|
| 6,823,815 B2 | 11/2004 | Han et al. | |
| 7,909,961 B2 | 3/2011 | Kumar et al. | |
| 8,152,925 B2* | 4/2012 | Iizuka | H01J 37/32623 |
| | | | 118/715 |
| 8,313,578 B2 | 11/2012 | Carducci et al. | |
| 8,869,742 B2 | 10/2014 | Dhindsa et al. | |
| 8,900,398 B2 | 12/2014 | Dhindsa et al. | |
| 9,597,704 B2* | 3/2017 | Koo | B05C 11/00 |
| 9,633,846 B2 | 4/2017 | Paterson et al. | |
| 10,224,221 B2 | 3/2019 | Singh et al. | |
| 10,763,138 B2* | 9/2020 | Kim | F16K 3/06 |
| 11,127,572 B2 | 9/2021 | Chen et al. | |
| 2003/0094135 A1* | 5/2003 | Komiya | H01J 37/32449 |
| | | | 156/345.33 |
| 2004/0129218 A1* | 7/2004 | Takahashi | H01J 37/32834 |
| | | | 118/728 |
| 2005/0103440 A1* | 5/2005 | Sato | H01J 37/3405 |
| | | | 156/345.29 |
| 2009/0206055 A1* | 8/2009 | Sato | H01J 37/32623 |
| | | | 204/298.31 |
| 2011/0042009 A1* | 2/2011 | Lee | H01J 37/32623 |
| | | | 156/345.43 |
| 2011/0100553 A1* | 5/2011 | Dhindsa | H01J 37/32642 |
| | | | 156/345.43 |
| 2013/0126513 A1* | 5/2013 | Marakhtanov | H05B 7/18 |
| | | | 219/383 |
| 2014/0034240 A1* | 2/2014 | Kim | H01J 37/32633 |
| | | | 156/345.33 |
| 2014/0051253 A1* | 2/2014 | Guha | H01J 37/32633 |
| | | | 156/345.33 |
| 2015/0044873 A1* | 2/2015 | Kellogg | C23C 16/50 |
| | | | 438/694 |
| 2015/0064920 A1* | 3/2015 | Dhindsa | H01J 37/32816 |
| | | | 156/345.28 |
| 2016/0289827 A1 | 10/2016 | Augustyniak et al. | |
| 2017/0162401 A1* | 6/2017 | Kang | H01J 37/32633 |
| 2019/0066983 A1* | 2/2019 | Sung | H01L 21/6833 |
| 2019/0237344 A1* | 8/2019 | Lee | H01L 21/67017 |
| 2020/0051792 A1* | 2/2020 | Chen | H01J 37/32623 |

FOREIGN PATENT DOCUMENTS

| | | |
|---|---|---|
| KR | 10-2014-0017414 A | 2/2014 |
| KR | 20-2018-0003064 U | 10/2018 |
| KR | 10-2178105 B1 | 11/2020 |
| KR | 10-2021-0030993 A | 3/2021 |

* cited by examiner

PLASMA CONFINEMENT RING, SEMICONDUCTOR MANUFACTURING APPARATUS INCLUDING THE SAME, AND METHOD OF MANUFACTURING A SEMICONDUCTOR DEVICE USING THE SAME

CROSS-REFERENCE TO RELATED APPLICATIONS

This application claims priority from Korean Patent Application No. 10-2021-0055971, filed on Apr. 29, 2021, in the Korean Intellectual Property Office, the entire contents of which are incorporated herein by reference.

BACKGROUND

The present disclosure relates to a plasma confinement ring, a semiconductor manufacturing apparatus including the same, and a method of manufacturing a semiconductor device using the same, and in particular, to a plasma confinement ring capable of improving uniformity of a plasma density, a semiconductor manufacturing apparatus including the same, and a method of fabricating a semiconductor device using the same.

A process of manufacturing a semiconductor device includes various processes. For example, the semiconductor device may be manufactured through a photolithography process, an etching process, and a deposition process that is performed on a silicon wafer. A material in a plasma state is used in each of the processes, which are performed to manufactured the semiconductor device. In the process using the plasma, it is necessary to control a position of plasma produced in a semiconductor manufacturing apparatus. For example, it is necessary to concentrate the plasma on a wafer provided in the semiconductor manufacturing apparatus. For this, a plasma confinement ring is used to confine the plasma within a region on the wafer or to prevent the plasma from being produced outside the wafer. By using the plasma confinement ring, it is possible to control distribution of the plasma.

SUMMARY

An embodiment provides a plasma confinement ring capable of improving uniformity of the plasma distribution, a semiconductor manufacturing apparatus including the same, and a method of manufacturing a semiconductor device using the same.

An embodiment provides a plasma confinement ring, which is configured to prevent a plasma density from being concentrated on an edge region of a wafer, a semiconductor manufacturing apparatus including the same, and a method of manufacturing a semiconductor device using the same.

An embodiment provides a plasma confinement ring, which is configured to discharge a portion of the plasma to an underlying region through a slit during a process of manufacturing a semiconductor, a semiconductor manufacturing apparatus including the same, and a method of manufacturing a semiconductor device using the same.

An embodiment provides a plasma confinement ring, which is configured to variously control distribution of the plasma, if necessary, a semiconductor manufacturing apparatus including the same, and a method of manufacturing a semiconductor device using the same.

According to an embodiment, a plasma confinement ring may include: a lower ring, an upper ring on the lower ring, and a connection ring extended to connect the lower ring to the upper ring. The lower ring may include a lower center hole vertically penetrating the lower ring at a center of the lower ring and a plurality of slits penetrating the lower ring from a top surface to a bottom surface thereof in a region outside the lower center hole. A thickness of the lower ring may be smaller at a first region closer to the lower center hole than a second region farther from the lower center hole.

According to an embodiment, a semiconductor manufacturing apparatus may include a plasma confinement ring. The plasma confinement ring may include a lower ring providing a lower center hole and having a circular plate shape, an upper ring providing an upper center hole and having a circular plate shape, and a connection ring downwardly extended from the upper ring toward the lower ring to connect the lower ring to the upper ring. The lower ring may include a lower connection member providing the lower center hole and a lower body placed outside the lower connection member to provide at least one slit extended in a direction from the lower center hole to a circumference of the lower ring. A thickness of the slit at a first position, which is spaced apart from a center axis of the lower ring by a first distance, may be smaller than a thickness of the slit at a second position, which is spaced apart from the center axis of the lower ring by a second distance greater than the first distance. At the first position, a ratio of a width of the slit to the thickness of the slit may range from 0.37 to 1.5.

According to an embodiment, a method of manufacturing a semiconductor device may include disposing a wafer in a semiconductor manufacturing apparatus, supplying a process gas into the semiconductor manufacturing apparatus, producing plasma from at least a portion of the process gas in the semiconductor manufacturing apparatus, and controlling the plasma to process the wafer. The semiconductor manufacturing apparatus may include a housing, a chuck placed in the housing, an upper electrode spaced apart from the chuck in an upward direction, and a plasma confinement ring provided to enclose the chuck and the upper electrode. The chuck, the upper electrode, and the plasma confinement ring may be disposed to define a process space therebetween. The plasma confinement ring may include a lower ring enclosing the electrostatic chuck, an upper ring enclosing the upper electrode, and a connection ring extended to connect the lower ring to the upper ring. The lower ring may provide a plurality of slits which penetrate the lower ring and connects the process space to a space below the lower ring. Each of the slits may be extended in a radial direction of the lower ring. The lower ring may include a variable region of which a thickness varies in an outward or inward direction. The controlling of the plasma may include discharging a portion of the plasma, which is produced in the process space, to a space below the lower ring through the slits.

According to an embodiment, a plasma confinement ring may include a lower ring, an upper ring on the lower ring, and a connection ring extended to connect the lower ring to the upper ring. The lower ring may be provided to have a lower center hole penetrating the lower ring at a center of the lower ring and at least one slit penetrating the lower ring in a region outside the lower center hole. The slit may be structured to pass a more amount of air or gas or pass the air or gas more easily at a first portion closer to the center of the lower ring than at a second portion farther from the center of the lower ring.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
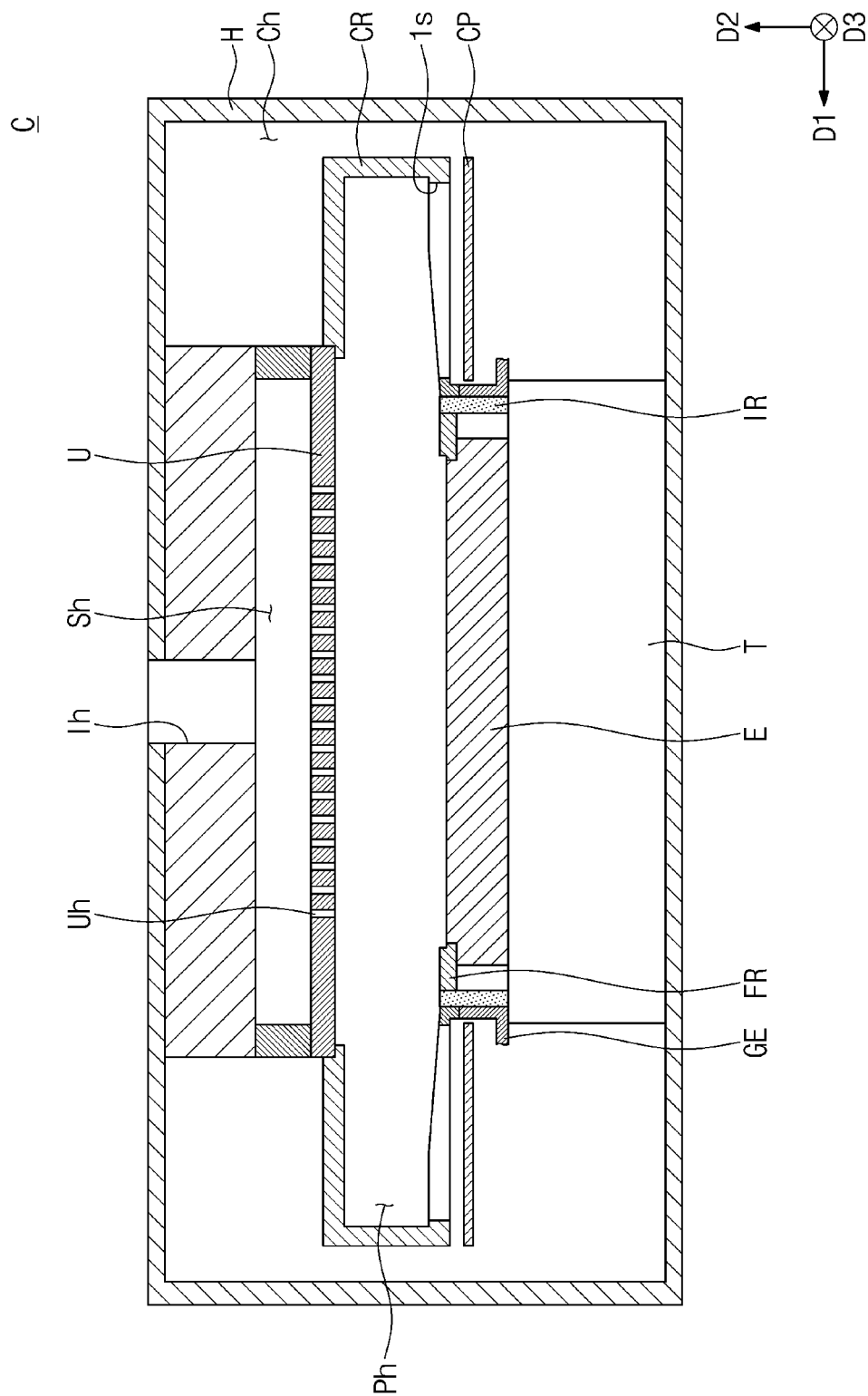
FIG. 1 is a sectional view illustrating a semiconductor manufacturing apparatus including a plasma confinement ring, according to an embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various embodiments of the inventive concepts will now be described more fully with reference to the accompanying drawings. All of the embodiment disclosed herein are example embodiment, and thus, the inventive concept is not limited thereto and may be realized in various other forms. Each of the embodiments provided in the following description is not excluded from being associated with one or more features of another embodiment also provided herein or not provided herein but consistent with the inventive concept. For example, even if matters described in a specific embodiment are not described in a different embodiment thereto, the matters may be understood as being related to or combined with the different embodiment, unless otherwise mentioned in descriptions thereof. In addition, it should be understood that all descriptions of principles, aspects, examples, and specific embodiments are intended to encompass structural and functional equivalents thereof.

Like reference numerals in the drawings denote like elements, and thus their description will be omitted.

FIG. 1 is a sectional view illustrating a semiconductor manufacturing apparatus including a plasma confinement ring, according to an embodiment.

In the present application, as shown in FIG. 1, the reference numbers D1, D2, and D3 will be used to denote a first direction, a second direction, and a third direction, respectively, which are not parallel to each other. Each of the first and third directions D1 and D3 may be referred to as a horizontal direction. The second direction D2 may be referred to as a vertical direction. Alternatively, the second direction D2 may be referred to as an upward direction. Thus, a direction, which is opposite to the second direction D2, may mean a downward direction.

Referring to FIG. 1, a semiconductor manufacturing apparatus C may be provided. The semiconductor manufacturing apparatus C may be an apparatus, which is used to process a semiconductor device. For example, the semiconductor manufacturing apparatus C may be an apparatus, which is used to perform an etching process on a wafer using plasma. In other words, the semiconductor manufacturing apparatus C may be an apparatus for a dry etching process. For example, the semiconductor manufacturing apparatus C may be a capacitively coupled plasma (CCP) apparatus. However, the inventive concept is not limited to this example, and in an embodiment, the semiconductor manufacturing apparatus C may be an etching apparatus, which is configured to perform an etching process using other etching methods (e.g., an inductively coupled plasma (ICP) apparatus). The semiconductor manufacturing apparatus C may include a housing H, a stage T, an electrostatic chuck E, a focus ring FR, an insulating ring IR, a plasma confinement ring CR, a slit open/close member CP, an upper electrode U, and a ground electrode GE.

The housing H may be configured to provide a chamber internal space Ch. Other elements, such as the stage T, may be disposed in the housing H. A process of manufacturing a semiconductor device may be performed in the housing H. For example, an etching process on a wafer W (e.g., FIG. 8) may be performed in the housing H. The housing H may provide an injection passage Ih. A process gas from the outside may be supplied into the housing H through the injection passage Ih.

The stage T may be placed in the housing H. The stage T may support the electrostatic chuck E and the focus ring FR. A heater, a cooling conduit, an RF power transmission part, and so forth may be placed in the stage T.

The electrostatic chuck E may be placed on the stage T. The electrostatic chuck E may be used to fasten the wafer W (e.g., see FIG. 8). For example, the electrostatic chuck E may fasten the wafer W on the electrostatic chuck E using an electrostatic force. In an embodiment, a heater, a plasma electrode, a bias electrode, and so forth may be placed in the electrostatic chuck E. The electrode in the electrostatic chuck E may be referred to as a lower electrode or an anode.

The focus ring FR may enclose the wafer W (e.g., see FIG. 8) disposed on the electrostatic chuck E. The focus ring FR may be formed of or include silicon (Si) and/or silicon carbide (SiC). The focus ring FR may concentrate plasma, which is produced during an etching process, in a region on the wafer W.

The insulating ring IR may enclose an outer sidewall of the focus ring FR. The insulating ring IR may electrically separate the focus ring FR from the plasma confinement ring CR.

The plasma confinement ring CR may enclose the wafer W (e.g., see FIG. 8) loaded on the electrostatic chuck E. For example, the plasma confinement ring CR may be provided around the focus ring FR, the insulating ring IR, and/or the upper electrode U. According to an embodiment, an upper portion of the plasma confinement ring CR may be provided around the upper electrode U to enclose the upper electrode U. For this, the upper portion of the plasma confinement ring CR may be directly coupled to an outer sidewall of the upper electrode U. However, the inventive concept is not limited to this example, and in an embodiment, the upper portion of the plasma confinement ring CR may be connected to the outer sidewall of the upper electrode U using another element. The upper portion of the plasma confinement ring CR may be referred to as an upper ring. A lower portion of the plasma confinement ring CR may be provided around the electrostatic chuck E, the focus ring FR, and/or the insulating ring IR to enclose them. For this, the lower portion of the plasma confinement ring CR may be directly coupled to an outer sidewall of the insulating ring IR. However, the inventive concept is not limited to this example, and in an embodiment, the lower portion of the plasma confinement ring CR may be connected to the outer sidewall of the insulating ring IR using another element. The lower portion of the plasma confinement ring CR may be referred to as a lower ring. A space between the upper electrode U and the electrostatic chuck E may be differentiated from the chamber internal space Ch by the plasma confinement ring CR. A region, which is differentiated from the chamber internal space Ch by the plasma confinement ring CR, may be referred to as a process space Ph. In other words, the process space Ph may be defined by the upper electrode U, the electrostatic chuck E, and the plasma confinement ring CR. In the present specification, when the plasma confinement ring CR is connected to the upper electrode U and/or the insulating ring IR, the chamber internal space Ch and the process space Ph may be described as two different spaces. The process space Ph may be a space, in which plasma is produced. The plasma confinement ring CR may be provided to have a slit 1s. Here, the slit 1s may be provided in the lower portion of the plasma confinement ring CR. The slit 1s may be a hole, which is extended to have a specific length in the horizontal direction, according to an embodiment. The process space Ph and the chamber internal space Ch may be connected to each other through the slit 1s. That is, the process space Ph may be connected to a space, which is placed below the plasma confinement ring CR, through the slit 1s. The plasma confinement ring CR will be described in more detail with reference to FIGS. 2 to 6C.

The slit open/close member CP may be placed below the slit 1s. The slit open/close member CP may be extended in the horizontal direction and may be shaped like a circular plate. The slit open/close member CP may be configured to be movable in the vertical direction. For this, the slit open/close member CP may be connected to an additional driving device. A vertical position of the slit open/close member CP may be controlled to adjust the extent of the opening of the slit 1s. For example, if the slit open/close member CP is moved toward the slit 1s in the second direction D2, a passage between the process space Ph and the chamber internal space Ch may become narrow. By contrast, if the slit open/close member CP is downwardly moved in a direction away from the slit 1s or in the opposite direction of the second direction D2, the passage between the process space Ph and the chamber internal space Ch may become wide. This will be described in more detail with reference to FIGS. 7 to 11.

The upper electrode U may be spaced apart from the electrostatic chuck E in the upward direction. For example, the upper electrode U may be spaced apart from a top surface of the electrostatic chuck E by about 35 mm in the second direction D2. The upper electrode U, along with the lower electrode in the electrostatic chuck E, may be used to produce plasma from the process gas in the process space Ph. The upper electrode U may be referred to as a shower head or a cathode. A distribution space Sh may be provided on the upper electrode U. The distribution space Sh may be connected to the injection passage Ih. A plurality of gas distribution holes Uh may be provided in the upper electrode U. The gas distribution holes Uh may be horizontally spaced apart from one another. The distribution space Sh and the process space Ph may be connected to each other through the gas distribution holes Uh. Thus, the process gas, which is supplied through the injection passage Ih, may be supplied into the process space Ph through the distribution space Sh and the gas distribution hole Uh.

The ground electrode GE may be connected to the lower portion of the plasma confinement ring CR. The ground electrode GE may be used to ground the upper electrode U. For this, the ground electrode GE may be grounded to the outside. The upper electrode U may be grounded through the plasma confinement ring CR and the ground electrode GE.

Hereinafter, a detailed structure of the plasma confinement ring CR will be described in more detail with reference to FIGS. 2 to 6C.

Figure 2:
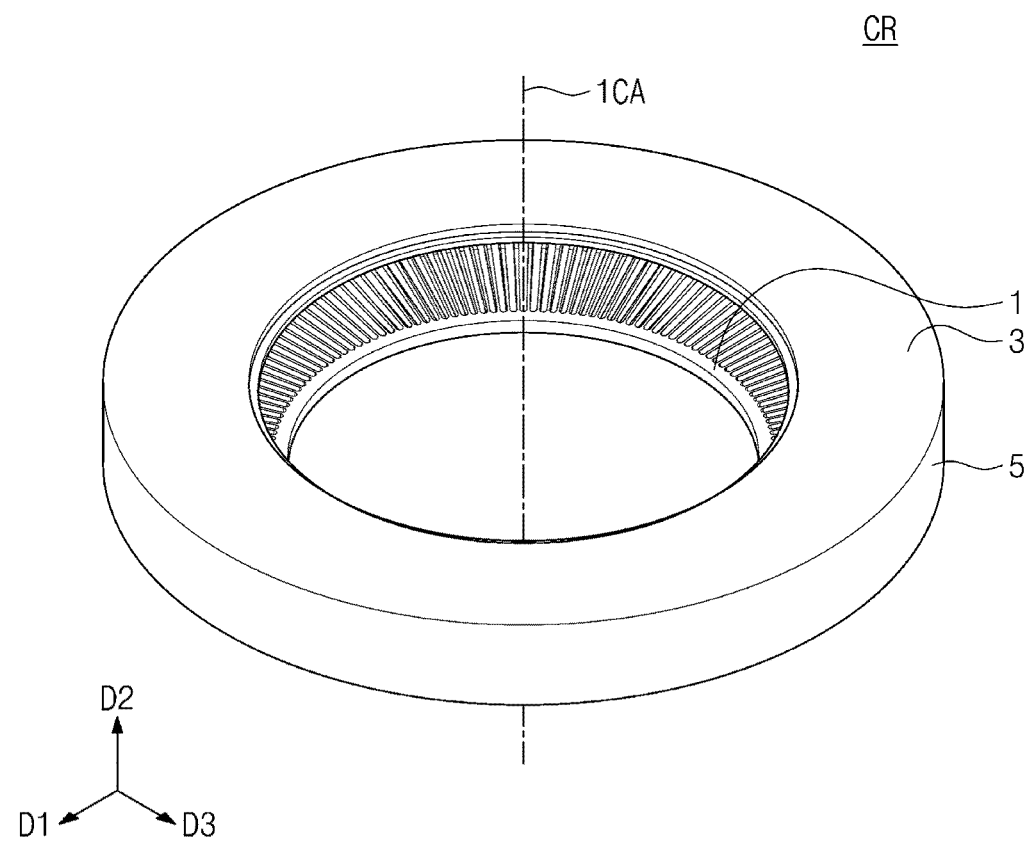
FIG. 2 is a perspective view illustrating a plasma confinement ring, according to an embodiment.
Figure 3:
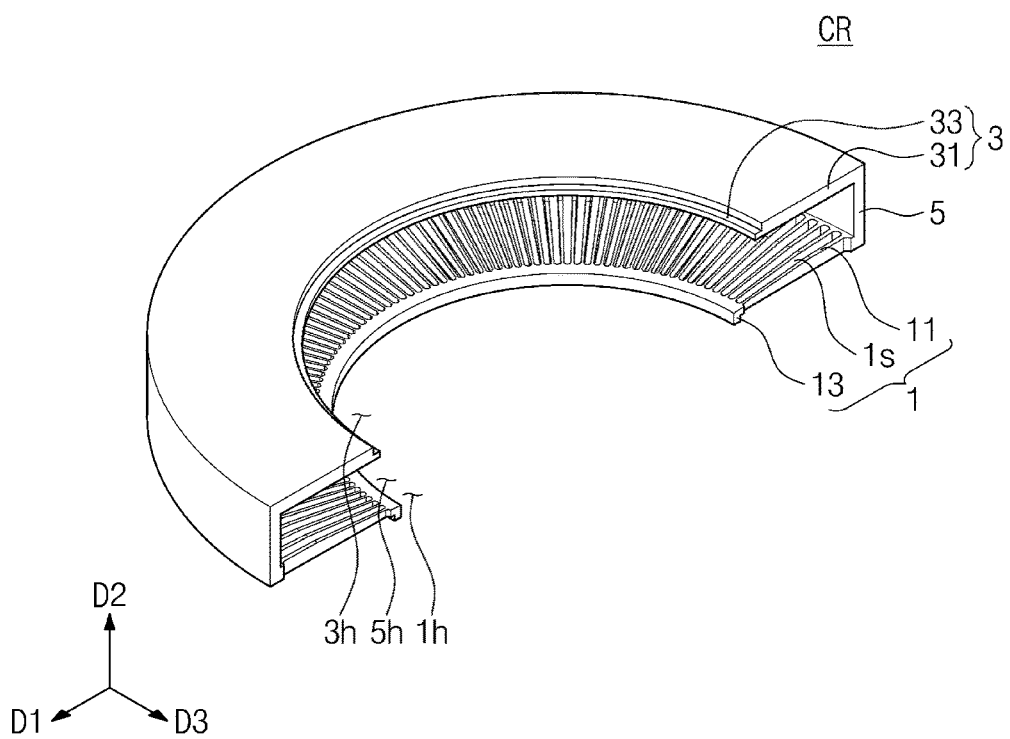
FIG. 3 is a partially-cut perspective view illustrating a plasma confinement ring, according to an embodiment.

FIG. 2 is a perspective view illustrating a plasma confinement ring, according to an embodiment, and FIG. 3 is a partially-cut perspective view illustrating a plasma confinement ring, according to an embodiment.

Referring to FIGS. 2 and 3, the plasma confinement ring CR may include a lower ring 1, an upper ring 3, and a connection ring 5.

Figure 4:
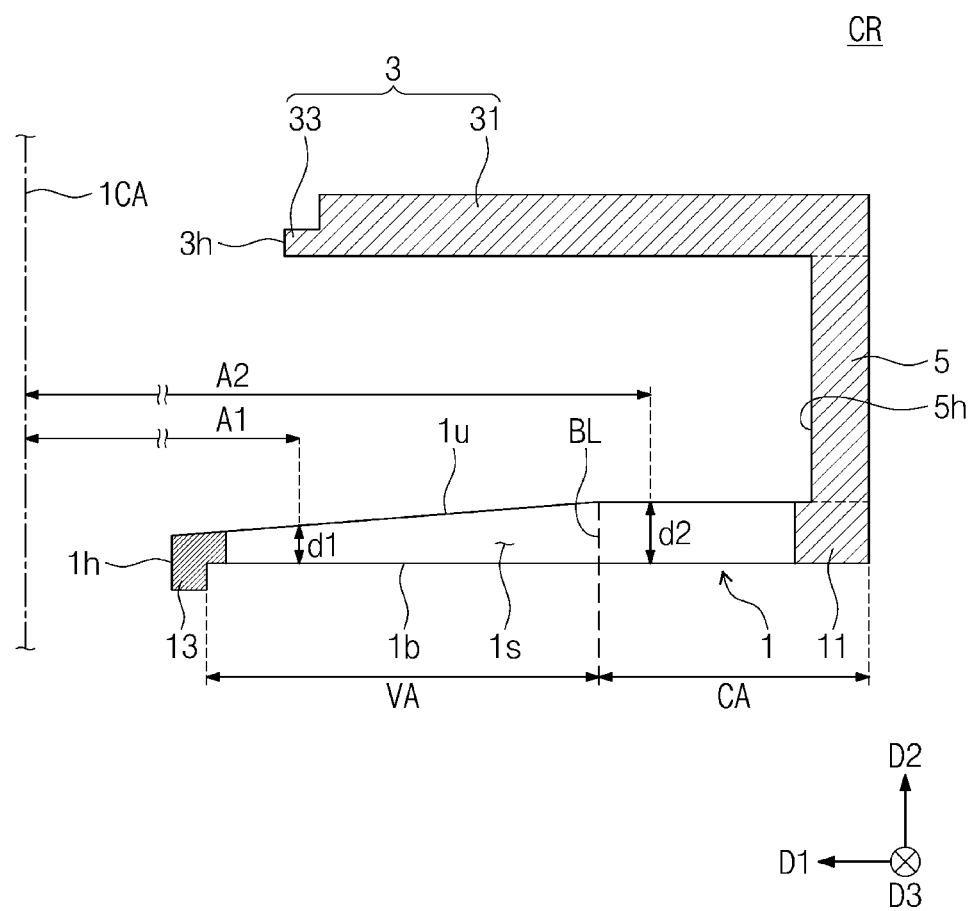
FIG. 4 is a sectional view illustrating a plasma confinement ring, according to an embodiment.
Figure 5:
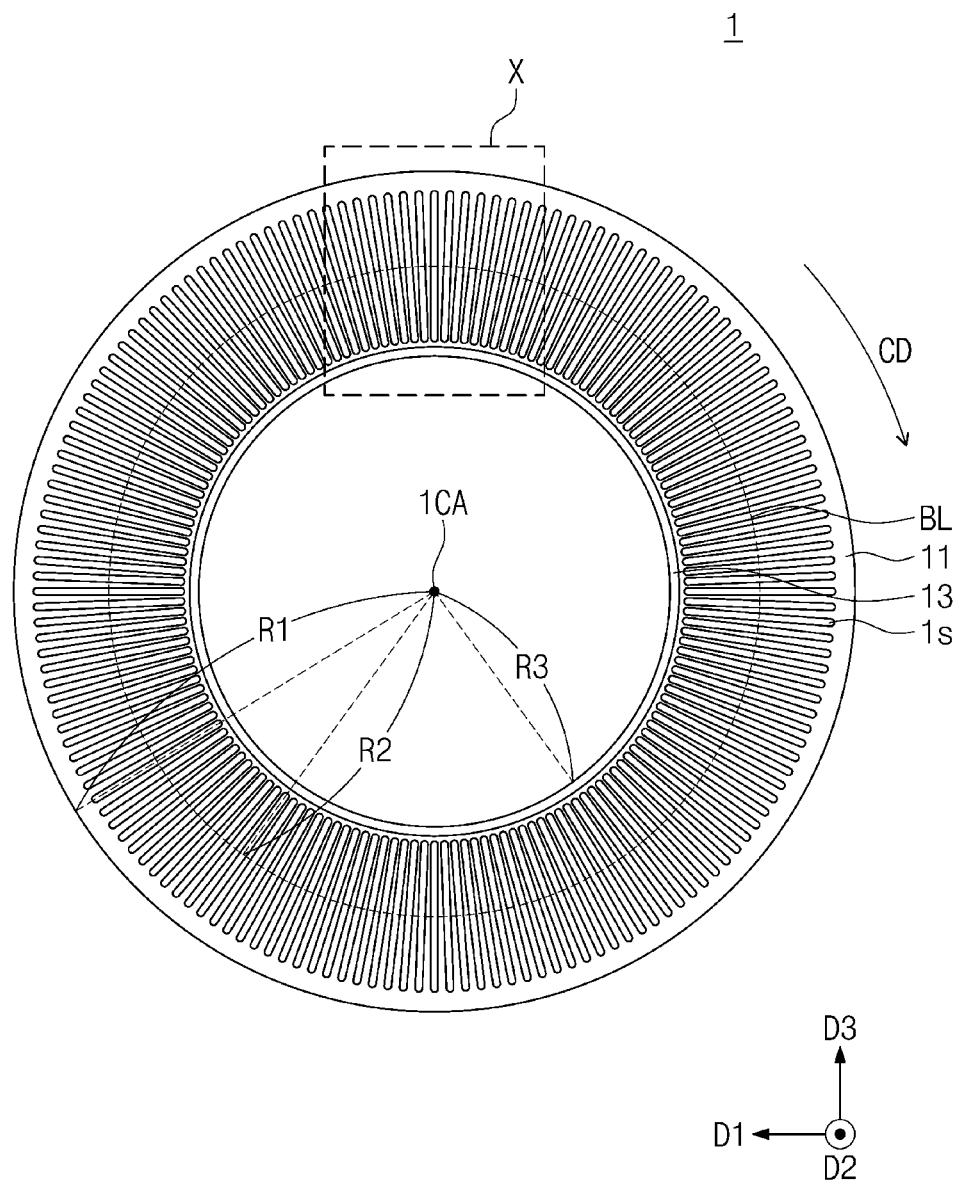
FIG. 5 is a plan view illustrating a lower ring of a plasma confinement ring, according to an embodiment.

The lower ring 1 may have a shape of circular plate. The lower ring 1 may have a lower center hole 1h, which is provided at a center thereof. The lower center hole 1h may be provided at the center of the lower ring 1 to vertically penetrate the lower ring 1. Thus, the lower ring 1 may be a circular-plate-shaped structure whose center region is pierced by the lower center hole 1h. A center axis 1CA of the lower ring 1 may be parallel to the second direction D2. The lower ring 1 may be a solid of revolution, which takes a form of circular rotation about the center axis 1CA. However, the inventive concept is not limited to this example, and in an embodiment, the lower ring 1 may have a three-dimensional shape, not the shape of revolution solid. At least a portion of a bottom surface of the lower ring 1 may be substantially perpendicular to the center axis 1CA. In an embodiment, the center axis 1CA of the lower ring 1 may coincide with a center axis of each of the upper and connection rings 3 and 5. The lower ring 1 may include a lower body 11 and a lower connection member 13. The lower body 11 may enclose the lower connection member 13 at an outer region thereof. In the present specification, the expression 'an outer region' will be used to denote a region that is far from the center axis 1CA in the horizontal direction. For example, a region, which is far from the center axis 1CA on a plane defined by the first and third directions D1 and D3, will be referred to as an outer region. In addition, the expression 'an inner region' will be used to denote a region that is close to the center axis 1CA. For example, a region, which is close to the center axis 1CA on a plane defined by the first and third directions D1 and D3, will be referred to as an inner region. The slit 1s may be provided in the lower body 11. The slit 1s may be placed in the outer region outside the lower center hole 1h. The slit 1s may penetrate the lower body 11 from a top surface to a bottom surface thereof. For example, the slit 1s may formed in the lower body 1 in a vertical direction. The slit 1s may be extended in a direction from the center to a circumference of the lower ring 1 by a specific length. This direction of the slit 1S may be a radial direction, which may mean a perpendicular direction away from the center axis 1CA of the lower ring 1 to the circumference of the lower ring 1, as shown in FIG. 5. In other words, the radial direction of the lower ring 1 may mean a direction that is extended outward from the lower ring 1. In an embodiment, a plurality of the slits is may be provided. The slits is may be spaced apart from one another in a circumferential direction of the lower ring 1, not being limited thereto. The circumferential direction of the lower ring 1 may mean a direction, which is defined along the circumference of the lower ring 1 to be orthogonal to the radial direction. This will be described in more detail with reference to FIG. 5. Hereinafter, one of the slits is will be described as a representative example of the slits 1s, for concise description. The lower connection member 13 may be placed inside the lower body 11. The lower connection member 13 may be thicker than the lower body 11, but the inventive concept is not limited to this example. Referring to FIG. 4, an inner side surface of the lower connection member 13 may define the lower center hole 1h. The lower connection member 13 may be connected to the insulating ring IR (e.g., see FIG. 1). The plasma confinement ring CR may be connected to an outer surface of the insulating ring IR by the lower connection member 13. It is noted here that the shape of the slit 1s may not be limited to ellipse as illustrated in FIG. 5 as long as it penetrates the lower body 11 from a top surface to a bottom surface thereof.

The upper ring 3 may be placed on the lower ring 1. The upper ring 3 may be spaced apart from the lower ring 1 in the second direction D2. The upper ring 3 may have a shape of a circular plate. The upper ring 3 may have an upper center hole 3h, which is provided at a center thereof. The upper center hole 3h may be provided at the center of the upper ring 3 to vertically penetrate the upper ring 3. Thus, the upper ring 3 may be a circular-plate-shaped structure whose center region is pierced by the upper center hole 3h. A center axis of the upper ring 3 may coincide with the center axis 1CA of the lower ring 1. At least a portion of top and bottom surfaces of the upper ring 3 may be substantially perpendicular to the center axis 1CA. The upper ring 3 may include an upper body 31 and an upper connection member 33. The upper body 31 may be placed outside the upper connection member 33 to enclose the upper connection member 33. The upper connection member 33 may be placed within the upper body 31. The upper connection member 33 may be thinner than the upper body 31, but the inventive concept is not limited to this example. Referring to FIG. 4, an inner side surface of the upper connection member 33 may define the upper center hole 3h. The upper connection member 33 may be connected to the upper electrode U (e.g., see FIG. 1). The plasma confinement ring CR may be connected to an outer surface of the upper electrode U by the upper connection member 33.

The connection ring 5 may connect the lower ring 1 to the upper ring 3. For example, the connection ring 5 may be extended from the lower ring 1 in the second direction D2, and may be connected to the upper ring 3. However, the connection ring 5 may connect the lower ring 1 to the upper ring 3 not in the second direction D2 but in a direction inclined from the D2 direction, in another example. The connection ring 5 may be placed outside each of the lower and upper rings 1 and 3. Referring to FIG. 4, an inner side surface of the connection ring 5 may define a connection center hole 5h.

The plasma confinement ring CR may be formed of or include silicon (Si) and/or silicon carbide (SiC). Thus, the lower ring 1 may also be formed of or include silicon (Si) and/or silicon carbide (SiC).

FIG. 4 is a sectional view illustrating a plasma confinement ring, according to an embodiment.

Referring to FIG. 4, the lower ring 1 may include a variable region VA and a non-variable region CA. The lower body 11 may be divided into the variable region VA and the non-variable region CA. The variable region VA and the non-variable region CA may be divided by an imaginary boundary line BL.

In the variable region VA, the lower ring 1 may have a varying thickness in a direction from an outer region toward an inner region. For example, in the variable region VA, the thickness of the lower ring 1 may decrease toward the center axis 1CA, as shown in FIG. 4. That is, in the variable region VA, a thickness of the lower body 11 may decrease with decreasing distance from the center axis 1CA. At least a portion of the slit 1s may span the variable region VA. Accordingly, in the variable region VA, a thickness of the slit 1s defined by the lower body 11 may decrease toward the center axis 1CA. In the present specification, the term 'thickness' may mean a thickness measured in the vertical direction. For example, a thickness of the lower ring 1 at a specific point may be a length of the lower ring 1 measured in the second direction D2 at the specific point. In the variable region VA, a thickness of an element may variously change toward the center axis 1CA. For example, as shown in FIG. 4, the thickness of the lower ring 1 in the variable region VA may gradually decrease toward the center axis 1CA. The thickness of the lower ring 1 in the variable region VA may linearly decrease toward the center axis 1CA. For this, a top surface 1u of the lower ring 1 may decline downward toward the center axis 1CA. In other words, a level of the top surface 1u of the lower ring 1 in the variable region VA may be lowered toward the center axis 1CA. Thus, in the variable region VA, a distance between the top surface 1u of the lower ring 1 and the bottom surface of the upper ring 3 may increase toward the center axis 1CA. For example, a vertical distance between the top surface 1u of the lower ring 1 and the bottom surface of the upper ring 3 may range from 0.5 mm to 5 mm. By contrast, a bottom surface 1b of the lower ring 1 may be substantially perpendicular to the center axis 1CA. However, the inventive concept is not limited to this example, and the thickness of the lower ring 1 in the variable region VA may decrease in various other manners toward the center axis 1CA. This will be described in more detail with reference to FIGS. 12 to 21.

The non-variable region CA may be a region of the lower ring 1 that is provided to have a constant thickness. For example, the thickness of the lower body 11 in the non-variable region CA may be constant regardless of the distance from the center axis 1CA. At least a portion of the slit 1s may span the non-variable region CA. Accordingly, the thickness of the slit 1s defined by the lower body 11 may be constant in the non-variable region CA, regardless of the distance from the center axis 1CA.

The variable region VA may be placed inside the non-variable region CA. In other words, a distance between the variable region VA and the center axis 1CA may be smaller than a distance between the non-variable region CA and the center axis 1CA. A horizontal distance between an arbitrary point in the variable region VA and the center axis 1CA may be referred to as a first distance A1. A horizontal distance between an arbitrary point in the non-variable region CA and the center axis 1CA may be referred to as a second distance A2. Since the variable region VA is placed inside the non-variable region CA, the second distance A2 may be greater than the first distance A1. Thus, a thickness d1 of the slit 1s at a position spaced apart from the center axis 1CA by the first distance A1 may be smaller than a thickness d2 of the slit is at a position spaced apart from the center axis 1CA by the second distance A2. A length of the variable region VA in the radial direction may be longer than or equal to a length of the non-variable region CA in the radial direction, but the inventive concept is not limited to this example. This will be described in more detail with reference to FIGS. 6A to 6C.

Figure 6A:
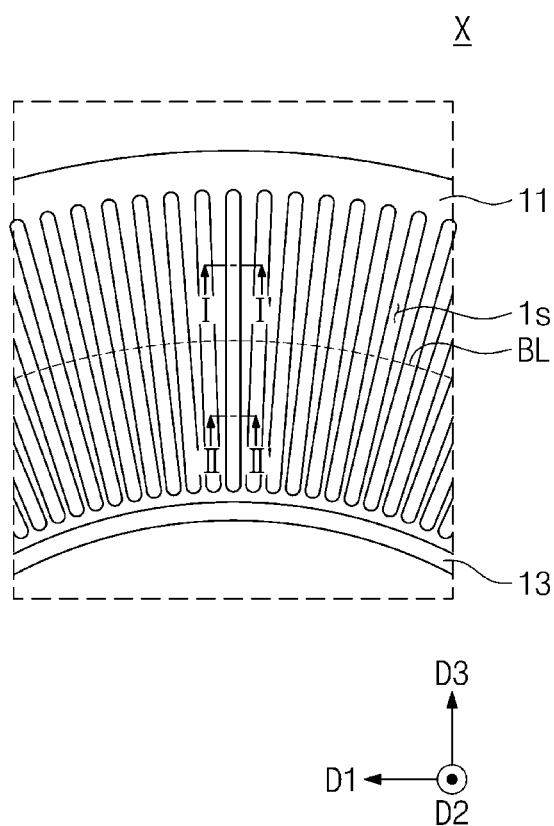
FIG. 6A is an enlarged plan view illustrating a portion 'X' of FIG. 5.

FIG. 5 is a plan view illustrating a lower ring of a plasma confinement ring, according to an embodiment, and FIG. 6A is an enlarged plan view illustrating a portion 'X' of FIG. 5.

Referring to FIGS. 5 and 6A, the slits is may be spaced apart from one another in a circumferential direction CD of the lower ring 1. The circumferential direction CD of the lower ring 1 may mean a direction defined along a circumference of the lower ring 1, as shown in FIG. 5. A distance from the center axis 1CA to the circumference of the lower body 11 may be referred to as a first radius R1. A distance from the center axis 1CA to the boundary line BL of the lower body 11 may be referred to as a second radius R2. A distance from the center axis 1CA to an inner side surface of the lower connection member 13 may be referred to as a third radius R3. Since the lower connection member 13 is placed inside the lower body 11, the third radius R3 may be smaller than the first radius R1. The second radius R2 may be smaller than the first radius R1 and may be larger than the third radius R3. The first distance A1 described with reference to FIG. 4 may be greater than the third radius R3 and may be smaller than the second radius R2. The second distance A2 may be greater than the second radius R2 and may be smaller than the first radius R1.

Figure 6B:
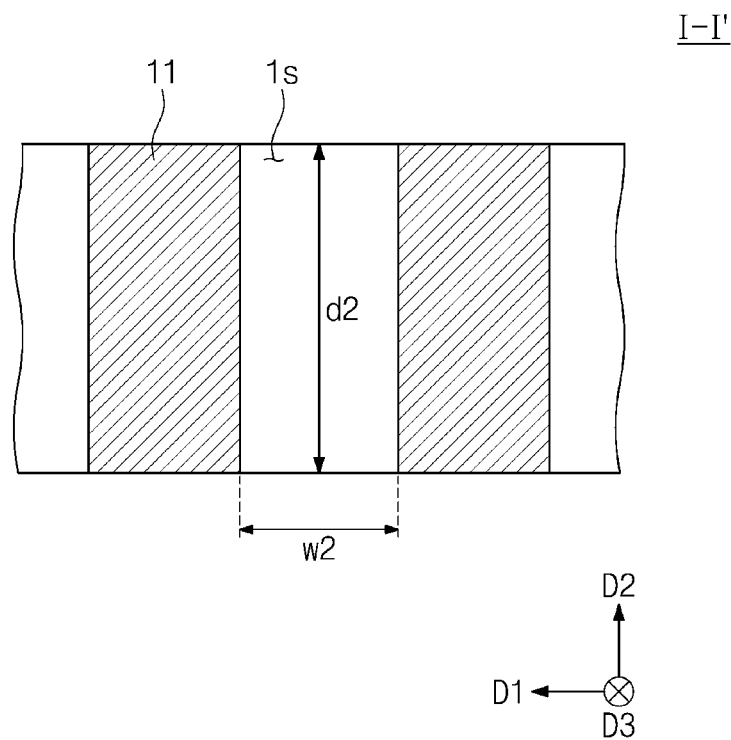
FIG. 6B is a sectional view taken along a line I-I' of FIG. 6A.
Figure 6C:
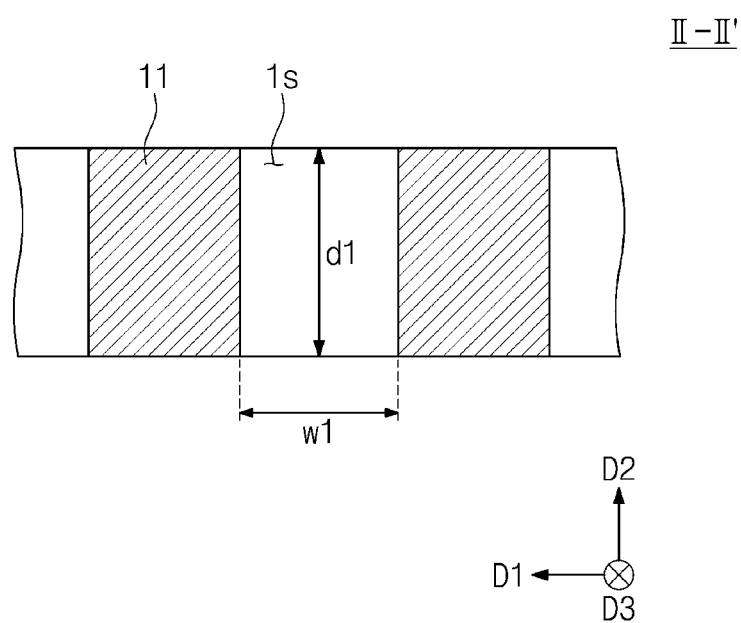
FIG. 6C is a sectional view taken along a line II-IF of FIG. 6A.

FIG. 6B is a sectional view taken along a line I-I' of FIG. 6A, and FIG. 6C is a sectional view taken along a line II-IF of FIG. 6A.

Referring to FIG. 6B, a width of the slit 1s in the non-variable region CA (e.g., see FIG. 4), which is placed outside the boundary line BL, may be referred to as a second width w2. The width of the slit 1s may mean a width of each slit 1s measured in the circumferential direction CD (e.g., see FIG. 5). In an embodiment, the second width w2 may range from about 2.3 mm to 2.7 mm. For example, the second width w2 may be about 2.54 mm. The thickness d2 of the slit 1s in the non-variable region CA (e.g., see FIG. 4) may range from about 5.0 mm to 9.0 mm. For example, the thickness d2 of the slit 1s in the non-variable region CA may be about 7.35 mm. As described above, the thickness d2 of the slit 1s may be constant throughout the non-variable region CA.

Referring to FIG. 6C, a width of the slit 1s in the variable region VA (e.g., see FIG. 4), which is placed inside the boundary line BL, may be referred to as a first width w1. In at least a portion in the variable region VA, a ratio w1/d1 of the width w1 to the thickness d1 of the slit 1s may be greater than or equal to 0.34. In the present specification, the term 'width-to-thickness ratio of slit' may mean a ratio of a width to a thickness of the slit, on a sectional view taken to be orthogonal to the radial direction of the lower ring. For example, in at least a portion in the variable region VA, the ratio w1/d1 of the width w1 of the slit 1s to the thickness d1 of the slit 1s may be greater than 0.37. In addition, the ratio w1/d1 of the width w1 of the slit 1s to the thickness d1 of the slit 1s may be less than 1.5. For example, the first width w1 may range from about 2.3 mm to 2.7 mm. For example, the first width w1 may be about 2.54 mm. In other words, the width of the slit 1s in the variable region VA may be equal to that in the non-variable region CA. In the variable region VA (e.g., see FIG. 4), the thickness d1 of the slit 1s may range from about 1.5 mm to 9.0 mm. As described above, the thickness d1 of the slit 1s in the variable region VA may decrease toward the center axis 1CA. That is, the thickness d1 of the slit 1s may range from about 1.5 mm to 9.0 mm, depending on a position in the variable region VA. For example, the thickness d1 of the slit 1s may range from about 4.0 mm to 7.35 mm, depending on a position in the variable region VA. A ratio d1m/d2 of the thickness d1m of the thinnest portion of the slit 1s in the variable region VA to the thickness d2 of the slit 1s in the non-variable region CA may range from about 0.20 to about 0.55. However, the inventive concept is not limited to these values, and the thicknesses d1 and d2 and the widths w1 and w2 of the slit 1s may be variously changed, depending on the design applied to the lower ring 1. For example, the thickness d1 and the width w1 of the slit 1s in the variable region VA may variously change, as long as the ratio w1/d1 of the width w1 to the thickness d1 is greater than or equal to 0.34. The thickness d1 and the width w1 of the slit 1s in the variable region VA may variously change, as long as the ratio w1/d1 of the width w1 to the thickness d1 is greater than or equal to 0.37.

The first width w1 of the slit 1s in the variable region VA may be substantially equal to or similar to the second width w2 of the slit 1s in the non-variable region CA. By contrast, the thickness d1 of the slit 1s in the variable region VA may be smaller than the thickness d2 of the slit 1s in the non-variable region CA. Thus, an aspect ratio of the slit 1s in the variable region VA may be smaller than an aspect ratio of the slit 1s in the non-variable region CA. That is, the width-to-thickness ratio (i.e., w1/d1) of the slit 1s in the variable region VA may be greater than the width-to-thickness ratio (i.e., w2/d2) of the slit 1s in the non-variable region CA.

Figure 7:
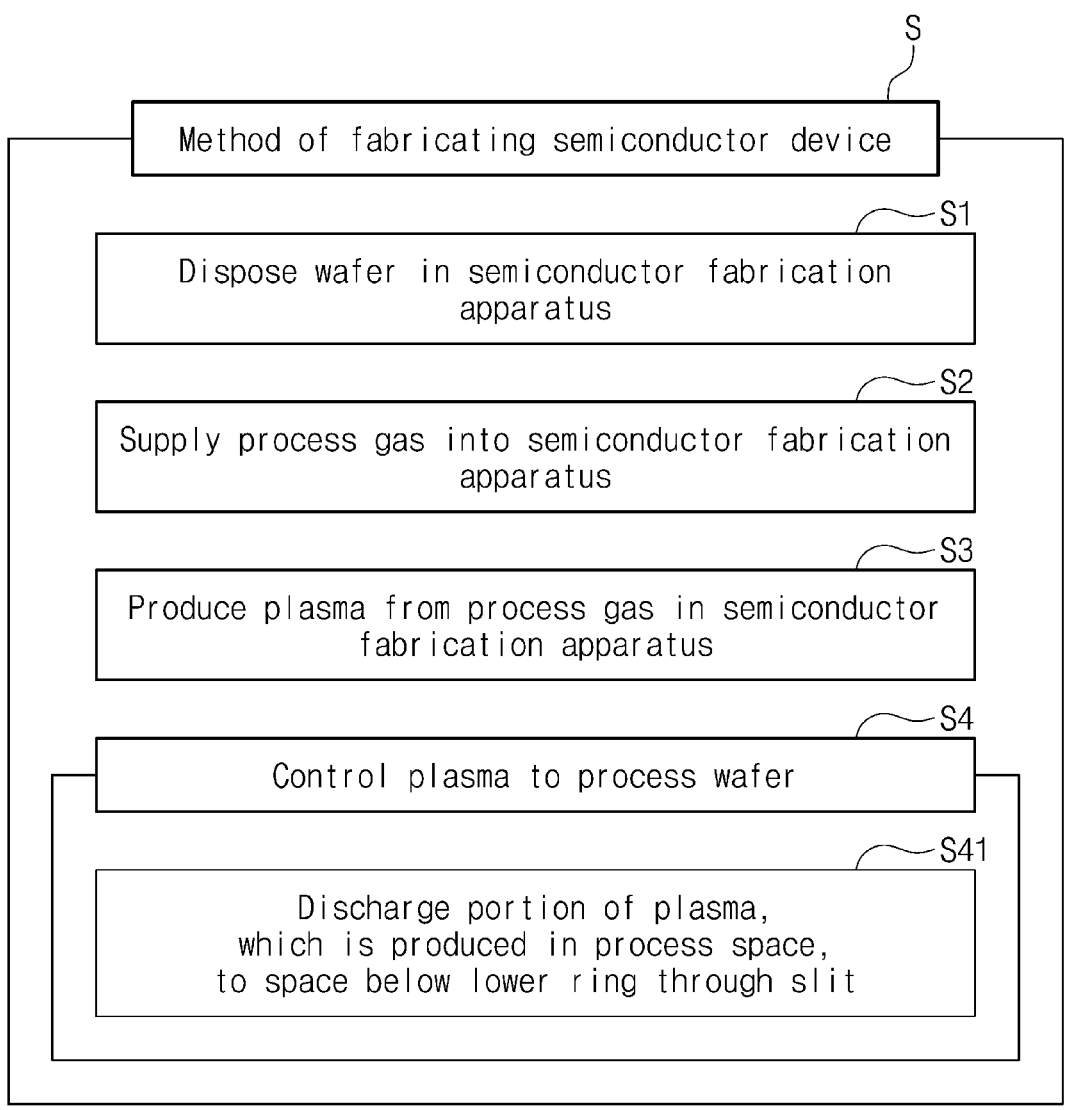
FIG. 7 is a flow chart illustrating a method of manufacturing a semiconductor device using a semiconductor manufacturing apparatus, which includes a plasma confinement ring, according to an embodiment.

FIG. 7 is a flow chart illustrating a method of manufacturing a semiconductor device using a semiconductor manufacturing apparatus, which includes a plasma confinement ring, according to an embodiment.

Referring to FIG. 7, a method of manufacturing a semiconductor device S may be provided. According to the manufacturing method S, a semiconductor device may be manufactured using the plasma confinement ring CR described with reference to FIGS. 1 to 6C. The manufacturing method S may include disposing a wafer in a semiconductor manufacturing apparatus (in S1), supplying a process gas into the semiconductor manufacturing apparatus (in S2), producing plasma from the process gas in the semiconductor manufacturing apparatus (in S3) and controlling the plasma to process the wafer (in S4). The controlling of the plasma (in S4) may include discharging a portion of plasma, which is produced in a process space, to a space below a lower ring through a slit (in S41).

Hereinafter, each step in the manufacturing method S will be described in more detail with reference to FIGS. 8 to 11.

Figure 8:
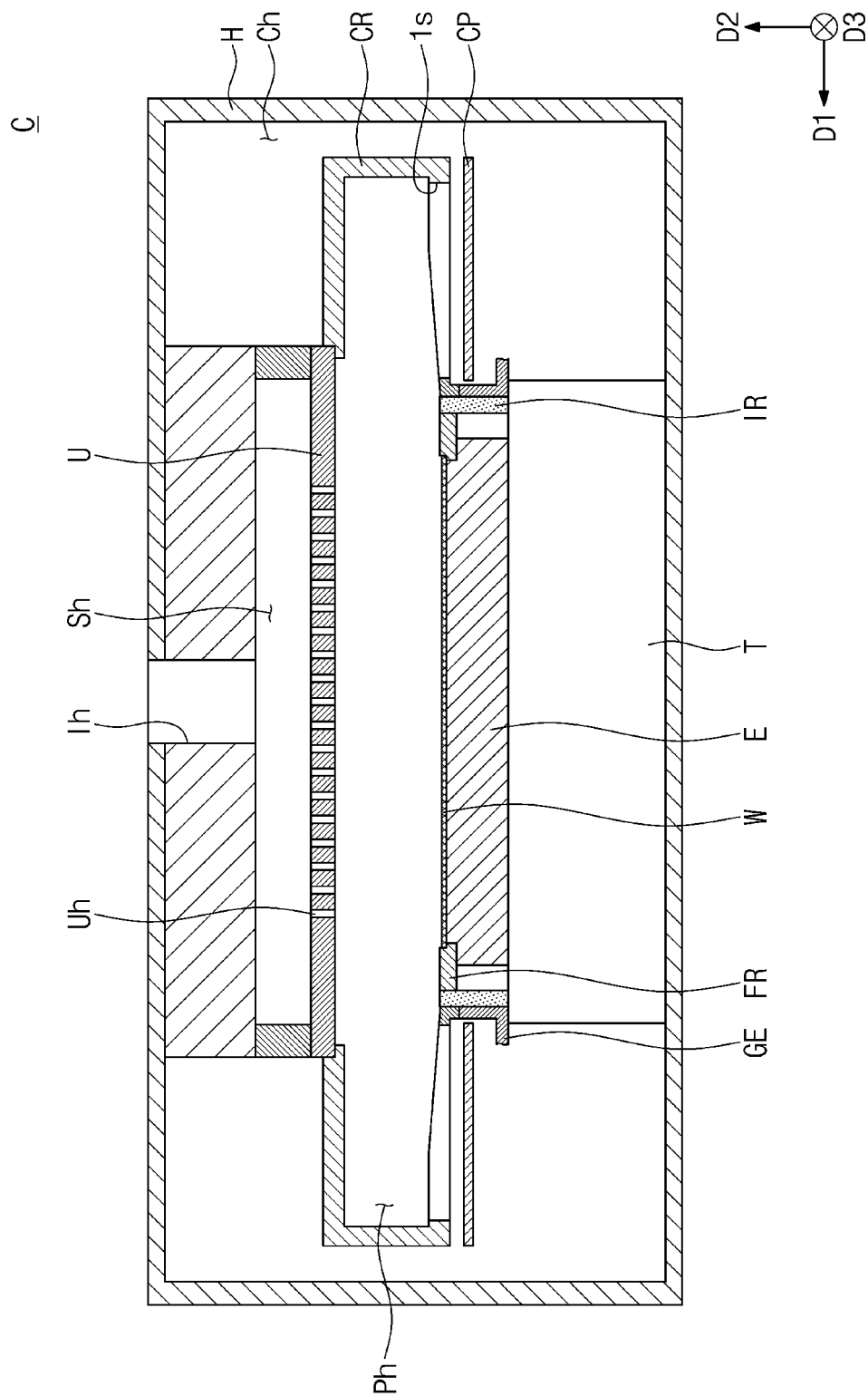
FIGS. 8 to 10 are sectional views, each of which illustrates a semiconductor manufacturing apparatus which is used to manufacture a semiconductor device using a manufacturing method, according to the flow chart of FIG. 7.
Figure 9:
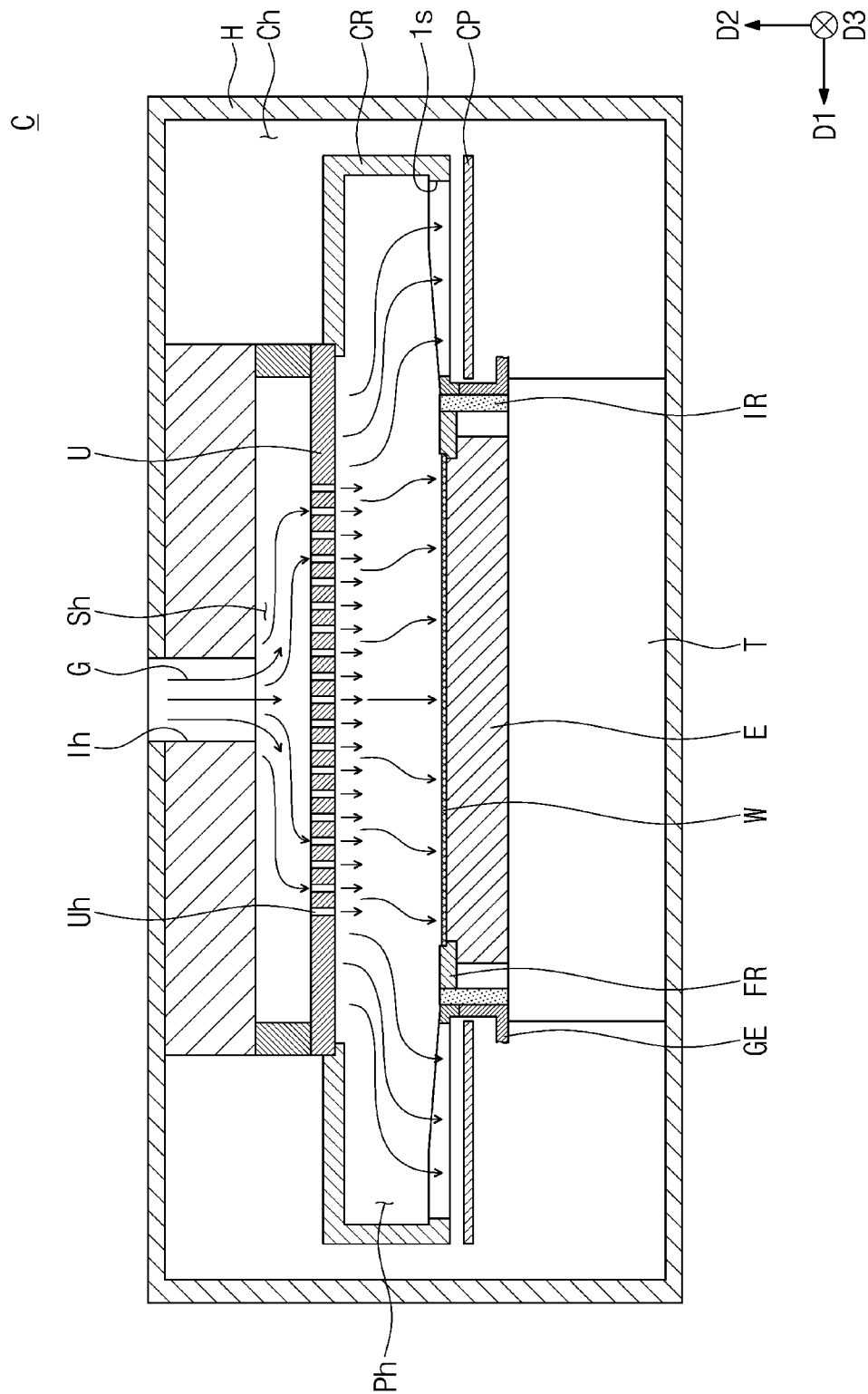
Figure 10:
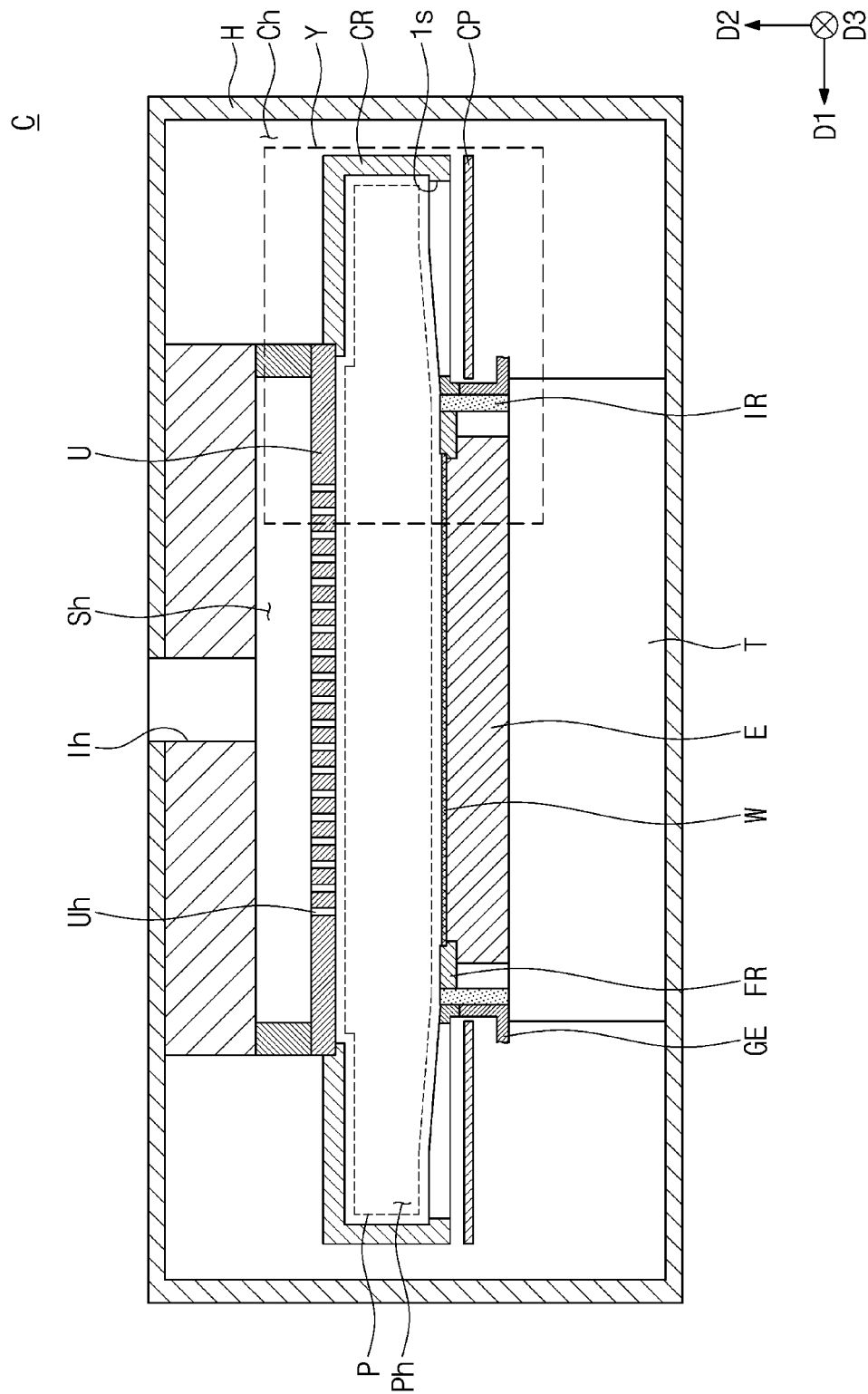
Figure 11:
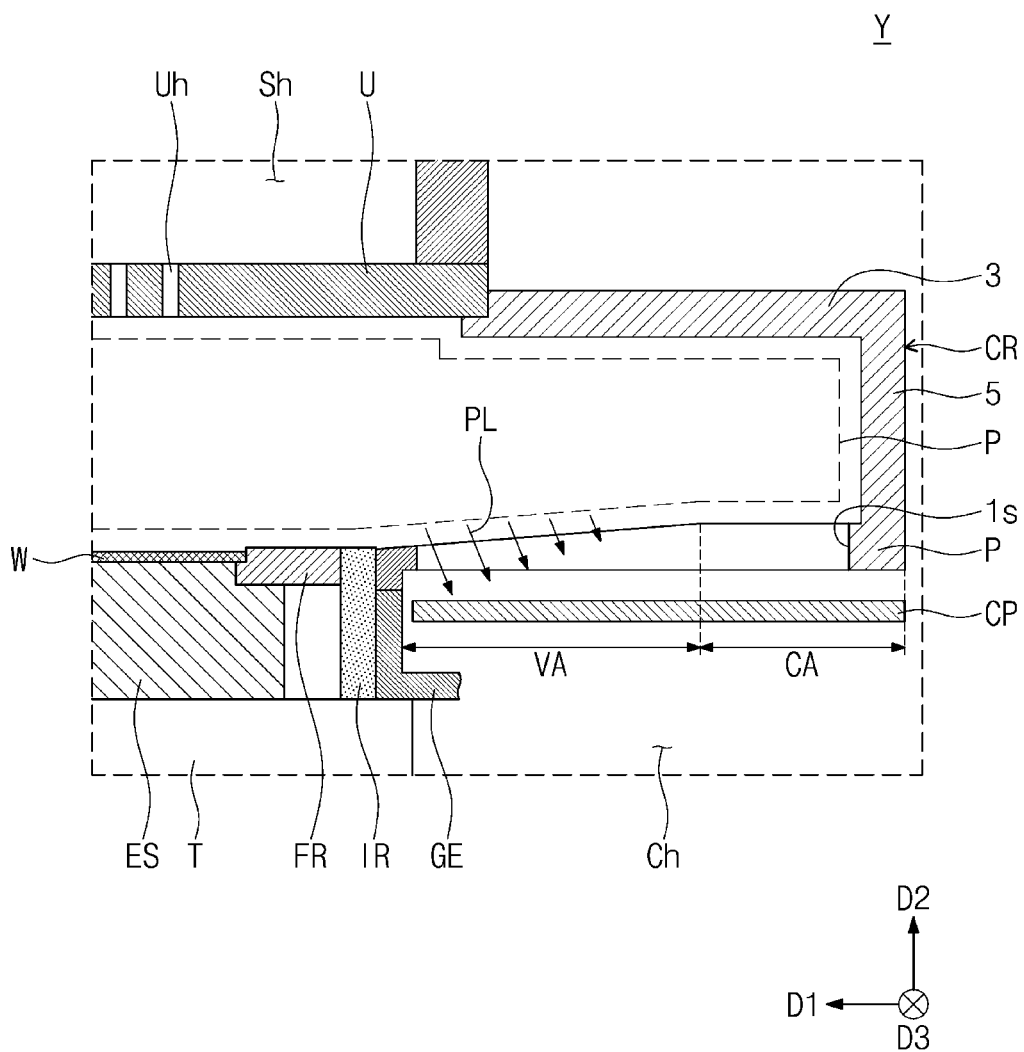
FIG. 11 is an enlarged sectional view illustrating a portion 'Y' of FIG. 10.

FIGS. 8 to 10 are sectional views, each of which illustrates a semiconductor manufacturing apparatus which is used to manufacture a semiconductor device using a manufacturing method according to the flow chart of FIG. 7, and FIG. 11 is an enlarged sectional view illustrating a portion 'Y' of FIG. 10.

Referring to FIGS. 8 and 7, the disposing of the wafer in the semiconductor manufacturing apparatus (in S1) may include disposing the wafer W on the electrostatic chuck E. The wafer W may be disposed on the electrostatic chuck E in various manners. For example, the wafer W may be disposed on the electrostatic chuck E using an additional robot arm. The disposing of the wafer W on the electrostatic chuck E may be performed when the electrostatic chuck E and the stage T are lowered in a downward direction. Thereafter, if the wafer W is loaded on the electrostatic chuck E, the electrostatic chuck E and the stage T may be elevated in an upward direction and may be placed in a region inside the plasma confinement ring CR. As a result of the elevation of the electrostatic chuck E, the process space Ph may become a separate space that is differentiated from the chamber internal space Ch.

Referring to FIGS. 9 and 7, the supplying of the process gas into the semiconductor manufacturing apparatus (in S2) may include supplying a process gas G, which is stored in a gas supplying part, into the semiconductor manufacturing apparatus C. The process gas G may mean a gas which is used for an etching process on the wafer W. In an embodiment, the process gas G may contain a $CF_4$ gas or the like. The process gas G may be supplied into the process space Ph through the injection passage Ih, the distribution space Sh, and the gas distribution hole Uh. A portion of the process gas G, which is injected into the process space Ph, may be discharged to a space, which is located below the plasma confinement ring CR, through the slit 1s of the plasma confinement ring CR. That is, a portion of the process gas Gin the process space Ph may be discharged to the chamber internal space Ch through the slit 1s. Other portion of the process gas G may be left in the process space Ph.

Referring to FIGS. 10 and 7, the producing of the plasma from the process gas in the semiconductor manufacturing apparatus (in S3) may include producing plasma P from at least a portion of the process gas G, which is left in the process space Ph, using the lower electrode in the electrostatic chuck E. By applying an RF power to the lower electrode, an electric field may be produced in the process space Ph, and in this case, the plasma P may be produced from at least a portion of the process gas G.

The controlling of the plasma (in S4) may include applying an RF power to a bias electrode to move the plasma to a region on the wafer W. In this step, the wafer W may be etched by the plasma.

Referring to FIGS. 11 and 7, the discharging of the portion of the plasma, which is produced in the process space, to the space below the lower ring through the slit (in S41) may include discharging the portion of the plasma P to the space below the plasma confinement ring CR through the slit 1s. Such a plasma leakage PL may occur in the variable region VA. The plasma leakage PL may not occur in the non-variable region CA and may be less than that in the variable region VA. The plasma leakage PL through the slit 1s may occur more actively in a region inside the plasma confinement ring CR. For example, the plasma leakage PL may occur more actively in a portion of the variable region VA close to the wafer W. The thickness of the slit 1s in the variable region VA may decrease toward the center axis 1CA. Accordingly, in the variable region VA, the ratio w1/d1 (e.g., see FIG. 4) of the width w1 to the thickness d1 of the slit 1s may increase toward the center axis 1CA. That is, in the variable region VA, an aspect ratio of a section of the slit 1s may decrease toward the center axis 1CA. If the aspect ratio of the slit 1s increases, it may be more difficult for the plasma P to pass through the slit 1s. In other words, the smaller the width of the slit 1s or the greater the thickness of the slit 1s, the more difficult the plasma P may pass through the slit 1s. Thus, the discharging of the plasma P through the slit 1s may become easy, as the distance from the center axis 1CA decreases in the variable region VA. Thus, the plasma leakage PL may occur more actively in an inner region of the lower ring 1.

If the plasma etching process on the wafer W is finished, the wafer W may be unloaded from the semiconductor manufacturing apparatus C. Thereafter, a photolithography process, a deposition process, a test process, and so forth may be further performed on the wafer W. Next, the wafer W may be diced into a plurality of semiconductor chips through a sawing process. The semiconductor device according to an embodiment may be manufactured through the afore-described steps.

In the plasma confinement ring CR, the semiconductor manufacturing apparatus C including the same, and the method of manufacturing a semiconductor device using the same, according to the present embodiment, a portion of the plasma P may be discharged to an underlying space through the slit 1s of the plasma confinement ring CR during the manufacturing process. For example, as described with reference to FIG. 11, a portion of the plasma P, which is produced near the inner portion of the plasma confinement ring CR, may be discharged to the underlying space. If the width-to-thickness ratio of the slit 1s is less than 0.34, the plasma P may not pass through the slit 1s due to a pinch-off phenomenon. In other words, the width-to-thickness ratio of 0.34 for the slit 1s may be a threshold value determining whether the plasma P can pass through the slit 1s. Since, in at least a portion of the variable region VA, the slit 1s has a width-to-thickness ratio of 0.34 or greater, the plasma P may overcome the pinch-off phenomenon and pass through the slit 1s. In particular, since the variable region VA includes a portion, in which the width-to-thickness ratio of the slit 1s is greater than or equal to 0.37, the plasma may easily pass or a more amount of the plasma may pass through the slit 1s at this portion. The portion having the width-to-thickness ratio of 0.37 or greater may exist in an inner portion of the variable region VA. Thus, a plasma density may be lowered near the inner portion of the plasma confinement ring CR. Accordingly, the plasma density may be lowered near an edge region of the wafer W. In other words, it may be possible to prevent or suppress the plasma density from being excessively increased near the edge region of the wafer W. This may make it possible to uniformly control the plasma density in the process space Ph. By improving the uniformity of the plasma distribution in this manner, it may be possible to increase a production yield in a process of manufacturing a semiconductor device.

In the plasma confinement ring, a semiconductor manufacturing apparatus including the same, and a method of manufacturing a semiconductor device using the same, according to the present embodiment, in an outer region (e.g., the non-variable region CA) of the plasma confinement ring CR, it may be difficult for the plasma P to pass through the slit. Thus, it may be possible to prevent a leakage amount of the plasma P from being excessively increased. This may make it possible to discharge the plasma P in a region having an excessively-high plasma density and to prevent the plasma P from being discharged in other regions. Since the amount and position of the plasma leakage can be controlled, it may be possible to prevent the plasma density from being lowered in the entire region and to improve the uniformity of the plasma density.

Figure 12:
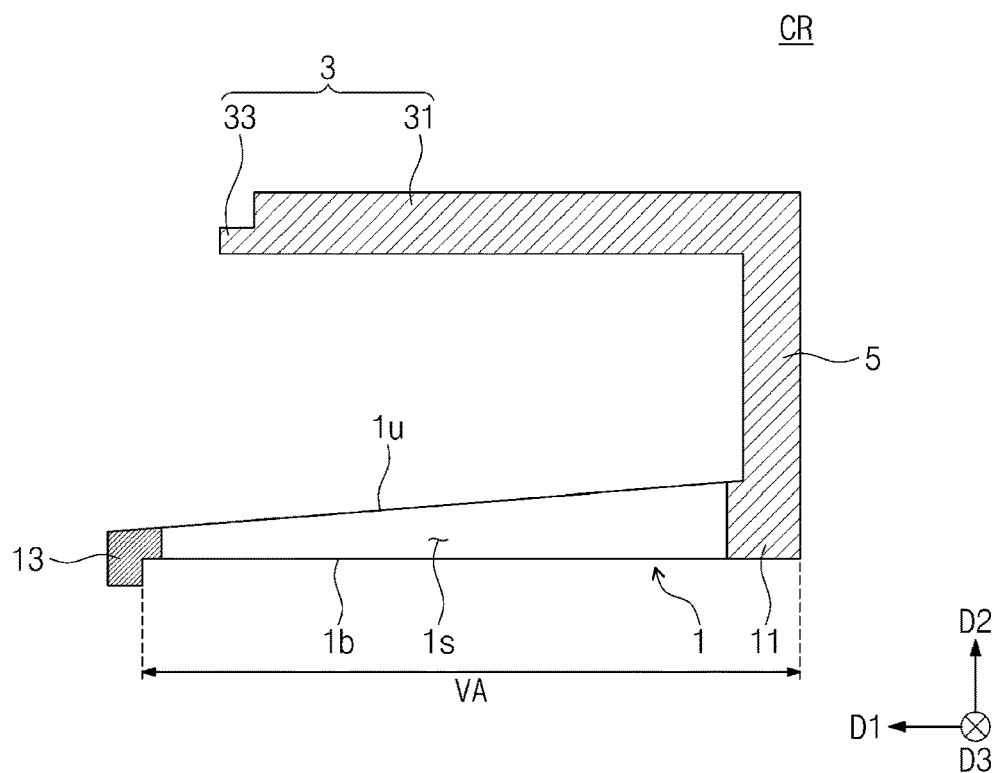
FIG. 12 is a sectional view illustrating a plasma confinement ring, according to an embodiment.

FIG. 12 is a sectional view illustrating a plasma confinement, ring according to an embodiment.

For concise description, an element previously described with reference to FIGS. 1 to 11 may be identified by the same reference number without repeating duplicate descriptions thereof.

Referring to FIG. 12, the lower ring 1 may not include the non-variable region CA described with reference to FIG. 4. That is, the entirety of the lower body 11 may be the variable region VA. In the variable region VA, the thickness of the lower body 11 may be linearly reduced toward the lower connection member 13. The variable region VA may include a portion, in which the width-to-thickness ratio of the slit 1s is less than or equal to 0.34, and another portion, in which the width-to-thickness ratio of the slit 1s is greater than or equal to 0.37, but the inventive concept is not limited to this example.

Figure 13:
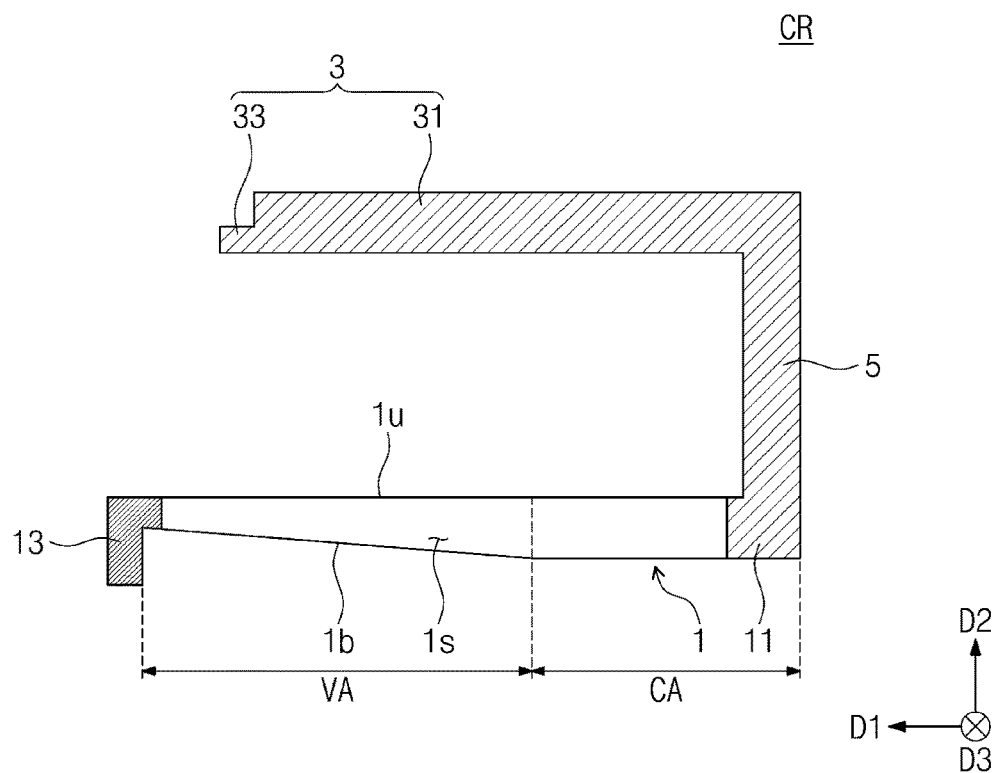
FIG. 13 is a sectional view illustrating a plasma confinement ring, according to an embodiment.

FIG. 13 is a sectional view illustrating a plasma confinement ring, according to an embodiment.

For concise description, an element previously described with reference to FIGS. 1 to 12 may be identified by the same reference number without repeating duplicate descriptions thereof.

Referring to FIG. 13, in the variable region VA, the top surface 1u of the lower ring 1 may be perpendicular to the second direction D2. By contrast, in the variable region VA, the bottom surface 1b of the lower ring 1 may be elevated toward the lower connection member 13. That is, in the variable region VA, the thickness of the lower ring 1 may be reduced in such a way that the bottom surface 1b is inclined upward toward the lower connection member 13.

Figure 14:
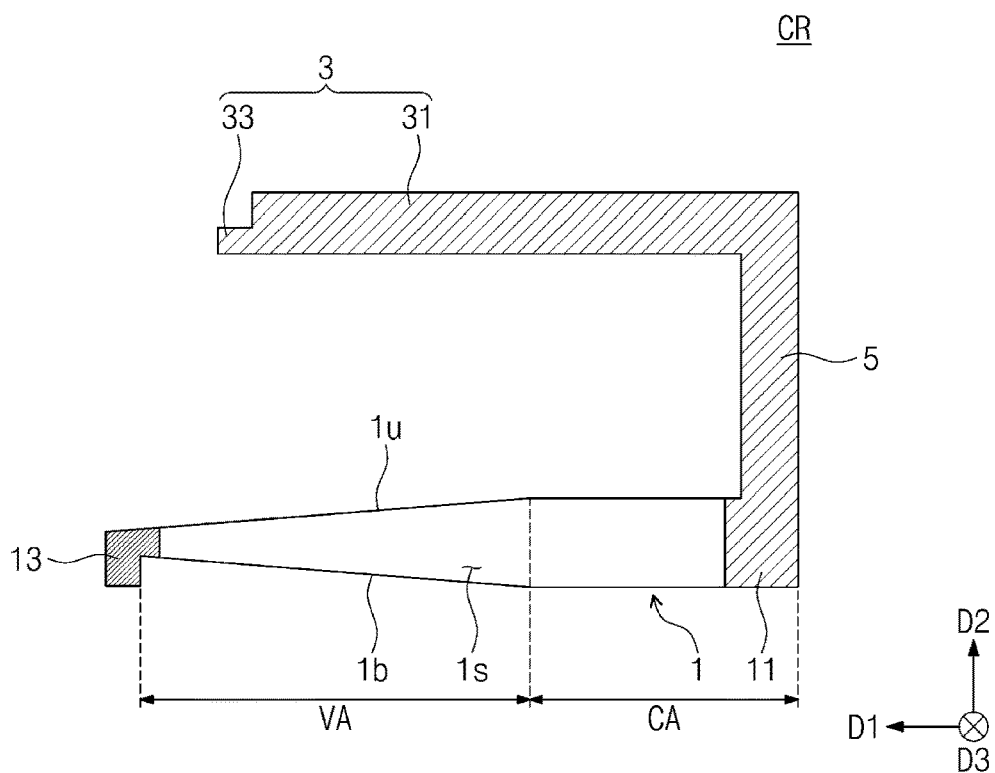
FIG. 14 is a sectional view illustrating a plasma confinement ring, according to an embodiment.

FIG. 14 is a sectional view illustrating a plasma confinement ring, according to an embodiment.

For concise description, an element previously described with reference to FIGS. 1 to 13 may be identified by the same reference number without repeating duplicate descriptions thereof.

Referring to FIG. 14, in the variable region VA, a level of the top surface 1u of the lower ring 1 may be lowered with decreasing distance from the lower connection member 13. In addition, in the variable region VA, a level of the bottom surface 1b of the lower ring 1 may be elevated, with decreasing distance from the lower connection member 13. That is, in the variable region VA, both of the top and bottom surfaces 1u and 1b may be inclined such that the lower ring 1 has a decreasing thickness with decreasing distance from the lower connection member 13.

Figure 15:
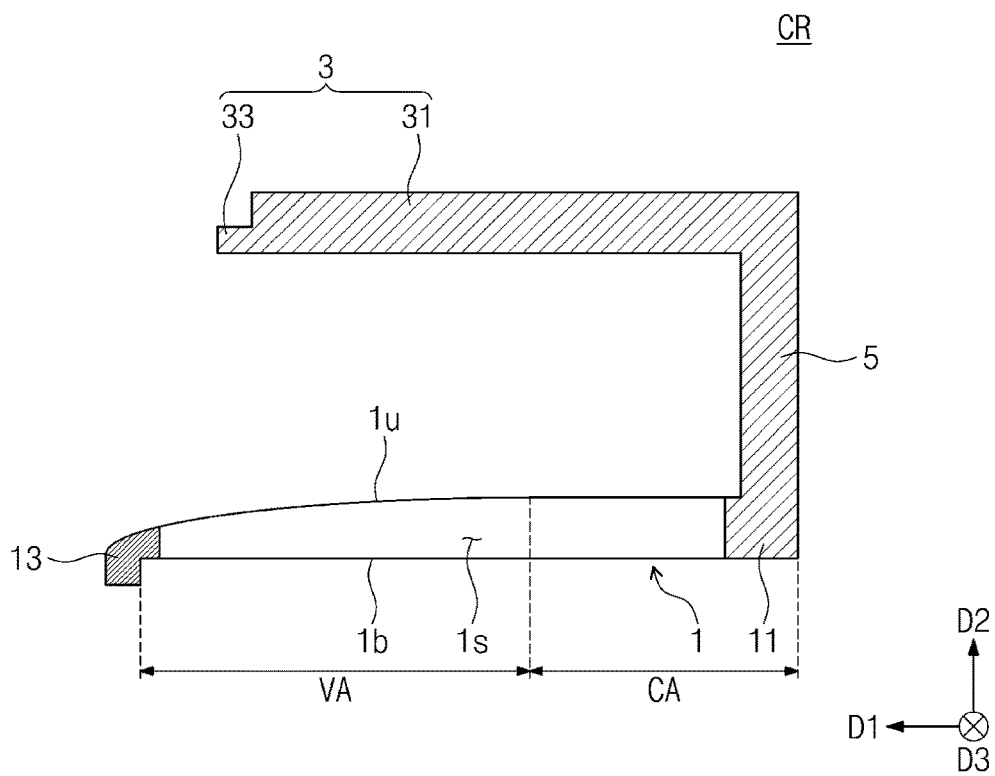
FIG. 15 is a sectional view illustrating a plasma confinement ring, according to an embodiment.

FIG. 15 is a sectional view illustrating a plasma confinement ring, according to an embodiment.

For concise description, an element previously described with reference to FIGS. 1 to 14 may be identified by the same reference number without repeating duplicate descriptions thereof.

Referring to FIG. 15, in the variable region VA, the top surface 1u of the lower ring 1 may be lowered toward the lower connection member 13, and may have a convexly curved shape. However, the inventive concept is not limited to this example, and in an embodiment, the top surface 1u of the lower ring 1 in the variable region VA may be lowered toward the lower connection member 13, and may have a concavely curved shape.

Figure 16:
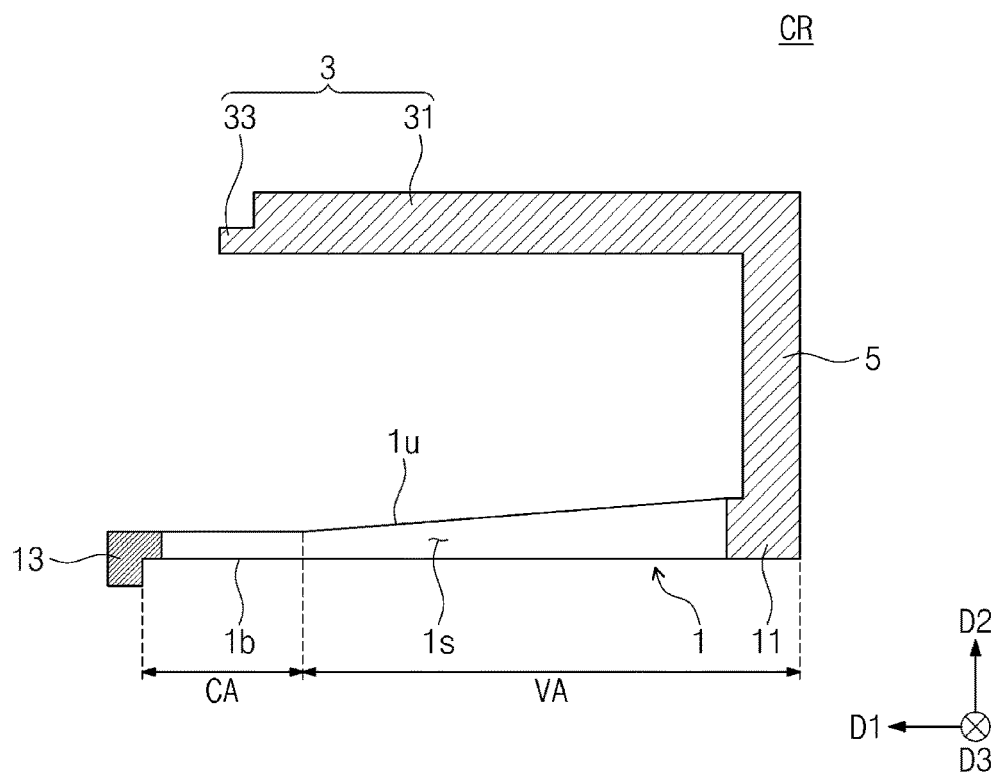
FIG. 16 is a sectional view illustrating a plasma confinement ring, according to an embodiment.

FIG. 16 is a sectional view illustrating a plasma confinement ring, according to an embodiment.

For concise description, an element previously described with reference to FIGS. 1 to 15 may be identified by the same reference number without repeating duplicate descriptions thereof.

Referring to FIG. 16, the variable region VA may be placed outside the non-variable region CA. The non-variable region CA may be connected to an inner portion of the variable region VA. The thickness of the slit 1s at the thinnest portion of the variable region VA may be substantially equal to or similar to the thickness of the slit 1s in the non-variable region CA.

Figure 17:
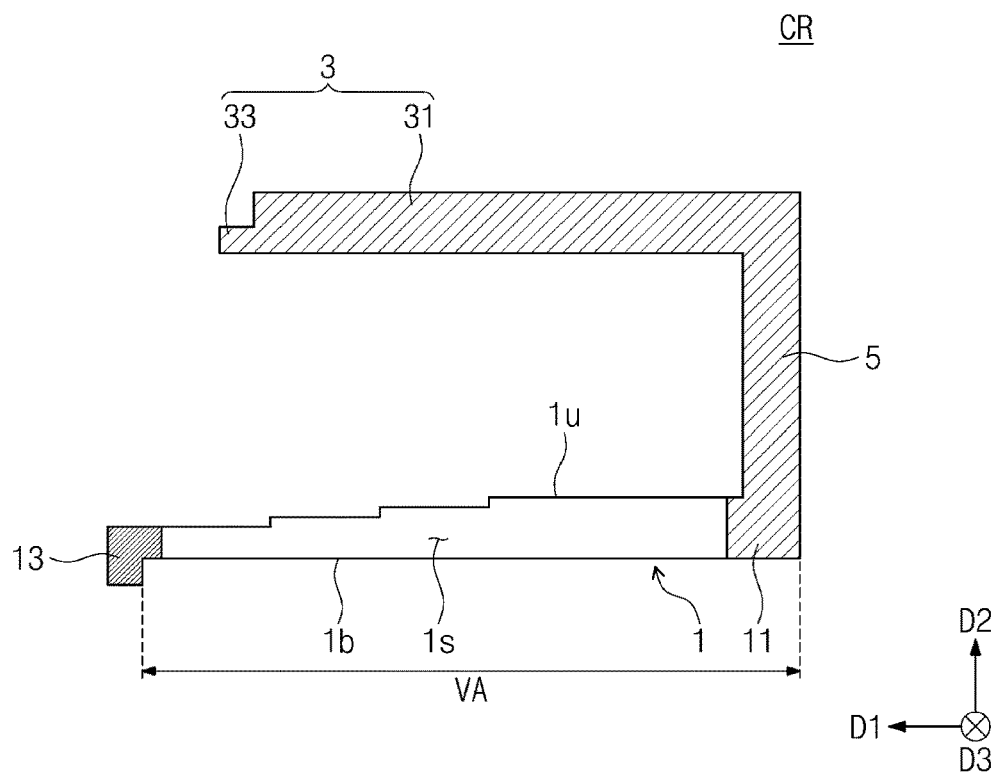
FIG. 17 is a sectional view illustrating a plasma confinement ring, according to an embodiment.

FIG. 17 is a sectional view illustrating a plasma confinement ring, according to an embodiment.

For concise description, an element previously described with reference to FIGS. 1 to 16 may be identified by the same reference number without repeating duplicate descriptions thereof.

Referring to FIG. 17, the lower ring 1 may not include the non-variable region CA (e.g., see FIG. 4). That is, the entirety of the lower body 11 may be the variable region VA. In the variable region VA, the thickness of the lower body 11 may be reduced in a stepwise manner toward the lower connection member 13. That is, in the variable region VA, the thickness of the lower body 11 may be reduced in the stepwise manner, not in a continuous manner, toward the lower connection member 13.

Figure 18:
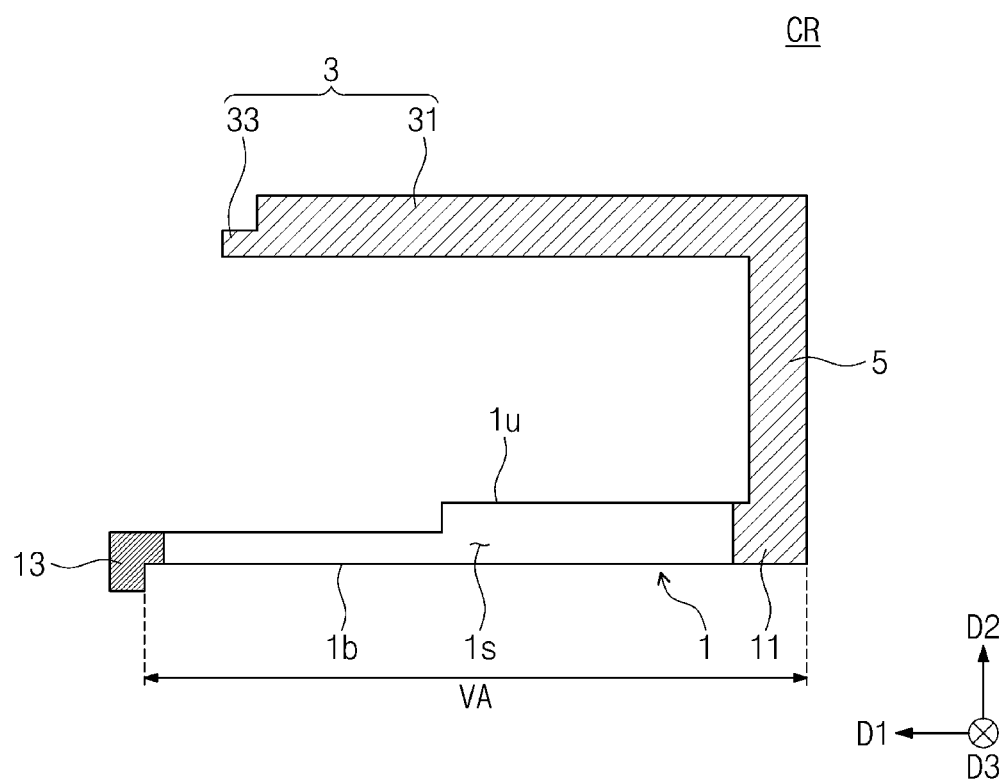
FIG. 18 is a sectional view illustrating a plasma confinement ring, according to an embodiment.

FIG. 18 is a sectional view illustrating a plasma confinement ring, according to an embodiment.

For concise description, an element previously described with reference to FIGS. 1 to 17 may be identified by the same reference number without repeating duplicate descriptions thereof.

Referring to FIG. 18, the lower ring 1 may not include the non-variable region CA (e.g., see FIG. 4). That is, the entirety of the lower body 11 may be the variable region VA. In the variable region VA, the thickness of the lower body 11 may be reduced in a stepwise manner with decreasing distance from the lower connection member 13. That is, in the variable region VA, the thickness of the lower body 11 may be reduced in the stepwise manner, not in a continuous manner, toward the lower connection member 13. However, in the present embodiment, the variable region VA may be provided to have only one stepped portion, unlike the structure illustrated in FIG. 17. That is, the lower body 11 may have two different thicknesses.

Figure 19:
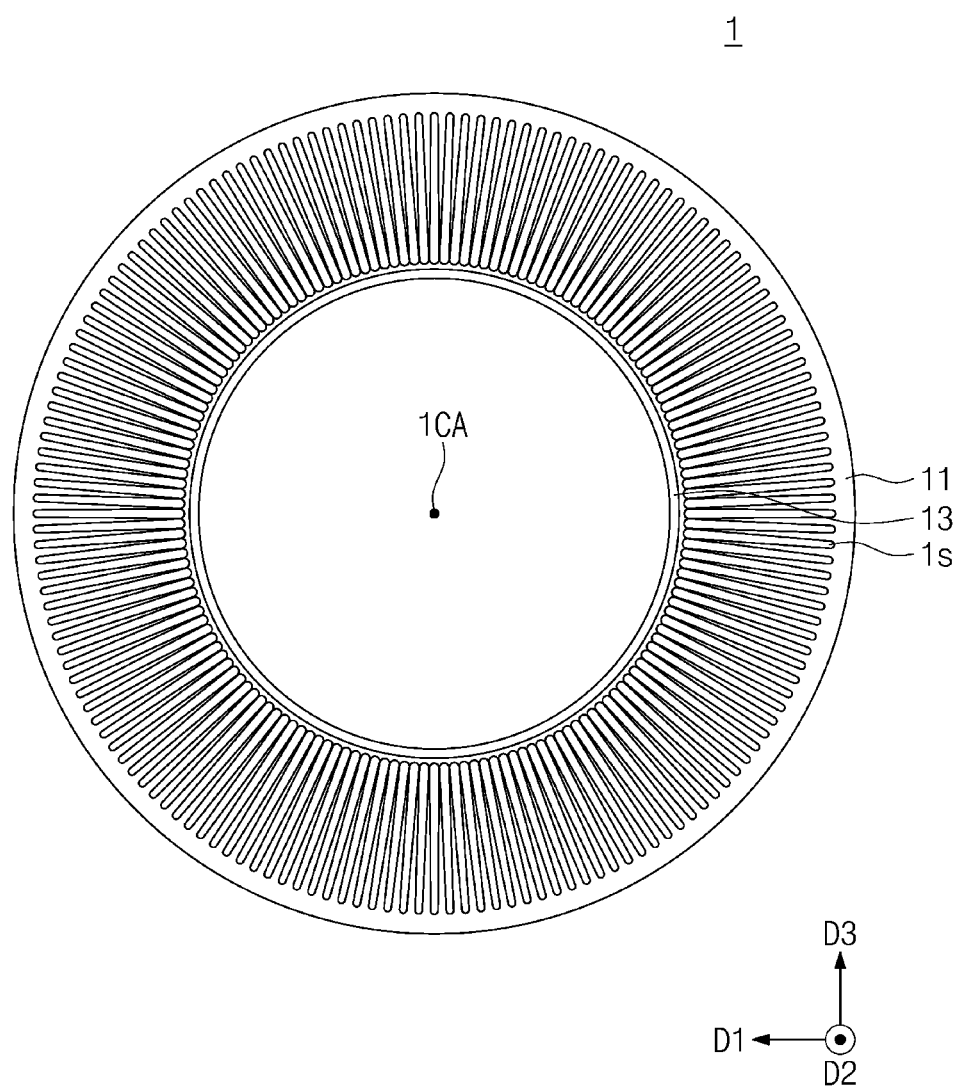
FIG. 19 is a plan view illustrating a lower ring of a plasma confinement ring, according to an embodiment.

FIG. 19 is a plan view illustrating a lower ring of a plasma confinement ring, according to an embodiment.

For concise description, an element previously described with reference to FIGS. 1 to 18 may be identified by the same reference number without repeating duplicate descriptions thereof.

Referring to FIG. 19, a width of the slit 1s of the lower ring 1 may increase toward the lower connection member 13. For example, at least a portion of the slit 1s may have a width increasing toward the center axis 1CA, unlike that described with reference to FIG. 5.

The slit 1s in the present embodiment may also be structured to allow the plasma to easily pass or a more amount of the plasma to pass at a portion closer to the lower connection member 13 than a portion farther from the lower connection member 13 by adjusting the width-to-thickness ratio of the slit 1s toward the lower connection member 13. Thus, in the present embodiment, the lower ring 1 may not have the variable region VA as in the previous embodiments. However, the lower ring 1 in the present embodiment may still have one of the sectional views shown in FIGS. 11-18.

In a plasma confinement ring, a semiconductor manufacturing apparatus including the same, and a method of manufacturing a semiconductor device using the same, according to the present embodiment, the width of the slit may increase toward the lower connection member 13. Thus, an aspect ratio of the slit may decrease toward the lower connection member 13. Accordingly, the plasma leakage through the slit may occur effectively near the inner region. The slit of FIG. 19 (e.g., having the varying width) may be also applied to the variable region described with reference to FIG. 4.

Figure 20:
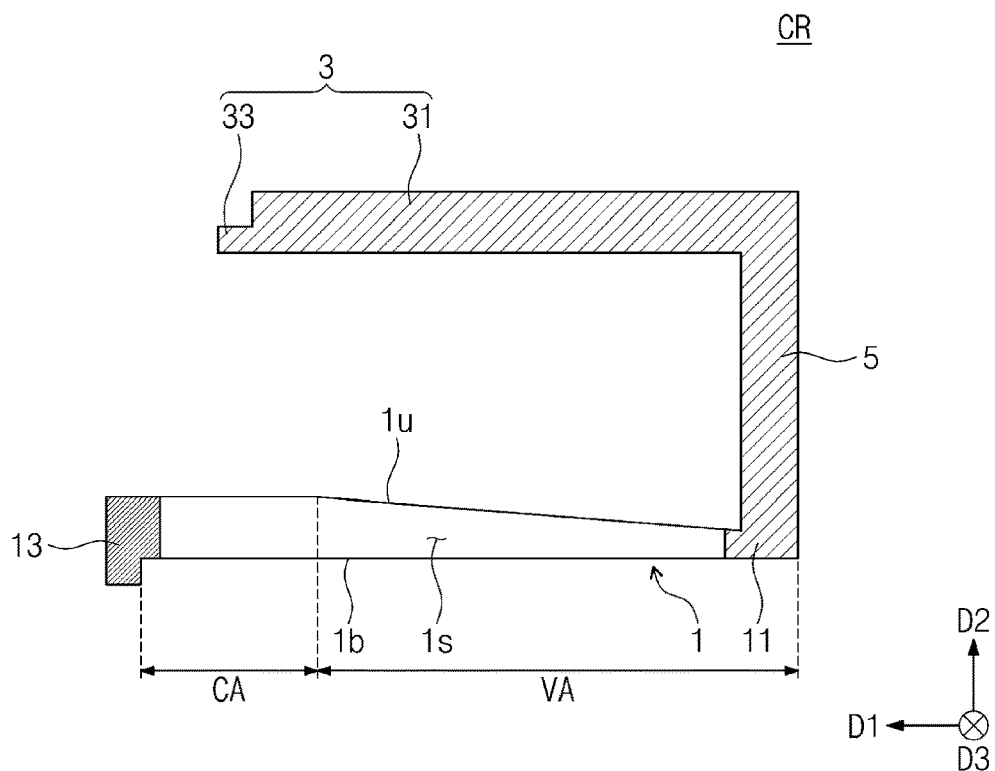
FIG. 20 is a sectional view illustrating a plasma confinement ring, according to an embodiment.

FIG. 20 is a sectional view illustrating a plasma confinement ring, according to an embodiment.

For concise description, an element previously described with reference to FIGS. 1 to 19 may be identified by the same reference number without repeating duplicate descriptions thereof.

Referring to FIG. 20, the variable region VA may be placed outside the non-variable region CA. The non-variable region CA may be connected to an inner portion of the variable region VA. Unlike that described with reference to FIG. 4, the variable region VA may have a thickness increasing toward the lower connection member 13. The thickness of the slit 1s at the thickest portion of the variable region VA may be substantially equal to or similar to the thickness of the slit 1s in the non-variable region CA.

In the present embodiment, however, the slit 1s may still be structured to allow the plasma to easily pass or a more amount of the plasma at a portion closer to the lower connection member 13 than a portion farther from the lower connection member by adjusting the width-to-thickness ratio of the slit 1s toward the lower connection member 13.

In a plasma confinement ring, a semiconductor manufacturing apparatus including the same, and a method of manufacturing a semiconductor device using the same, according to the present embodiment, the plasma leakage through the slit may occur near an outer region of the lower ring 1, unlike that described with reference to FIG. 11. If it is necessary to lower the plasma density near the outer region of the lower ring 1, not near the inner region, the plasma confinement ring described with reference to FIG. 20 may be used. In this case, the plasma on the outer region of the lower ring 1 may be discharged to the underlying space through the slit.

Figure 21:
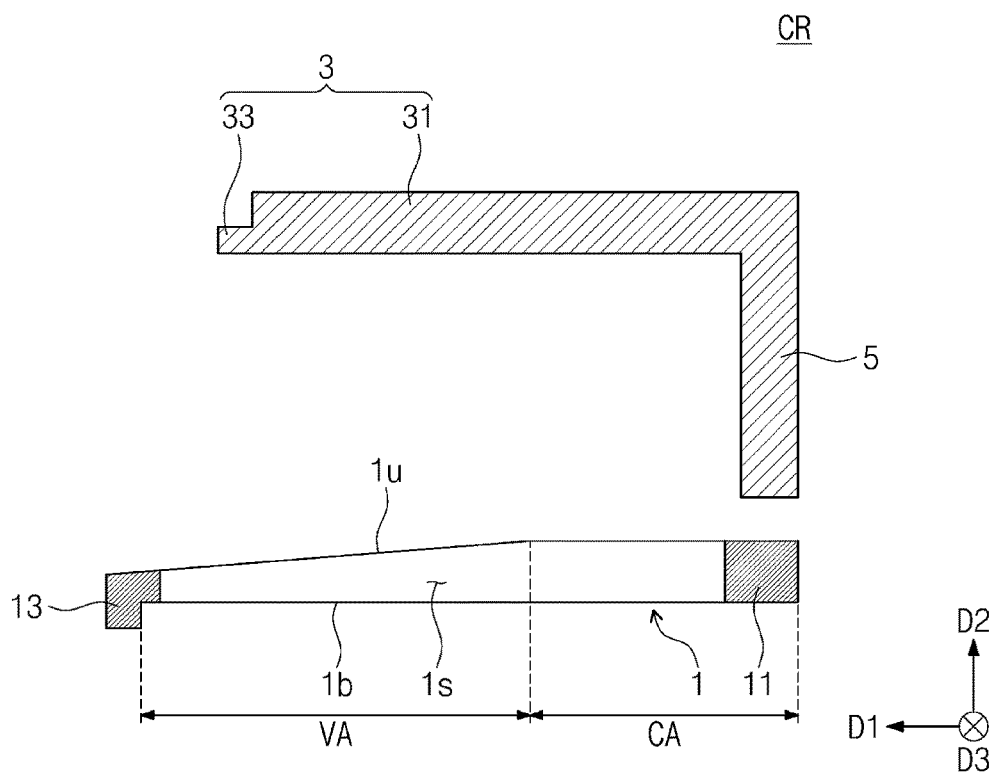
FIG. 21 is a sectional view illustrating a plasma confinement ring, according to an embodiment.

FIG. 21 is a sectional view illustrating a plasma confinement ring, according to an embodiment.

For concise description, an element previously described with reference to FIGS. 1 to 20 may be identified by the same reference number without repeating duplicate descriptions thereof.

Referring to FIG. 21, the lower ring 1 may be disassembled or separated from the upper ring 3 and the connection ring 5. An operation of assembling or disassembling the lower ring 1 may be performed in various manners. For example, the lower ring 1 may be assembled or coupled to the upper ring 3 and the connection ring 5 using an additional clamp. In an embodiment, various other mechanisms may be used to assemble the lower ring 1. Since the lower ring 1 can be disassembled, only the lower ring 1 may be selectively replaced. For example, in the case where a portion of the lower body 11 defining the slit 1s is damaged by the plasma discharged through the slit 1s, the upper ring 3 and the connection ring 5 may be left as they are, and only the lower ring 1 may be replaced with a new one. Due to the attachable/detachable structure of the plasma confinement ring CR, manufacturing costs may be reduced.

In a plasma confinement ring, a semiconductor manufacturing apparatus including the same, and a method of manufacturing a semiconductor device using the same, according to the above embodiments, it may be possible to improve uniformity of plasma.

In a plasma confinement ring, a semiconductor manufacturing apparatus including the same, and a method of manufacturing a semiconductor device using the same, according to the above embodiments, it may be possible to prevent a plasma density from being excessively increased on an edge region of a wafer.

In a plasma confinement ring, a semiconductor manufacturing apparatus including the same, and a method of manufacturing a semiconductor device using the same, according to the above embodiments, it may be possible to discharge a portion of the plasma to an underlying region through a slit during a process of manufacturing the semiconductor device.

In a plasma confinement ring, a semiconductor manufacturing apparatus including the same, and a method of manufacturing a semiconductor device using the same, according to the above embodiments, it may be possible to variously control distribution of the plasma, if necessary.

While example embodiments have been particularly shown and described, it will be understood by one of ordinary skill in the art that variations in form and detail may be made therein without departing from the spirit and scope of the attached claims.

What is claimed is:

1. A plasma confinement ring comprising: a lower ring; an upper ring on the lower ring; and a connection ring extended to connect the lower ring to the upper ring,
wherein the lower ring comprises:
a lower center hole vertically penetrating the lower ring at a center of the lower ring; and
a plurality of slits penetrating the lower ring from a top surface to a bottom surface thereof in a region outside the lower center hole,
wherein a thickness of the lower ring is smaller at a first region closer to the lower center hole than a second region farther from the lower center hole,
wherein the first region of the lower ring is included in a variable region of the lower ring of which a thickness decreases, in a continuous, non-stepwise manner, toward the center of the lower ring, and the second region of the lower ring is included in a non-variable region of the lower ring of which a thickness is constant toward the center of the lower ring,
wherein each of the plurality of slits comprises a first end and a second end spaced apart from each other in a radial direction of the lower ring,
wherein a ratio of a width in a circumferential direction to a thickness of each of the plurality of slits increases from the first end to the second end, and wherein, in the first region of each of the plurality of slits, the ratio of the width in the circumferential direction to the thickness ranges from 0.37 to 1.5.

2. The plasma confinement ring of claim 1, wherein widths of the plurality of slits are same or substantially same in an entire region across the lower ring.

3. The plasma confinement ring of claim 1, wherein, in the first region, a vertical distance between the top surface of the lower ring and the bottom surface of the upper ring ranges from 0.5 mm to 5 mm.

4. The plasma confinement ring of claim 1, wherein a length of each of the plurality of slits in the radial direction of the lower ring is greater than a half of a length of the lower ring in the radial direction of the lower ring.

5. The plasma confinement ring of claim 1, wherein a ratio of a thickness of the thinnest portion of a slit, among the plurality of slits, in the variable region to a thickness of the slit in the non-variable region ranges from 0.20 to 0.55.

6. The plasma confinement ring of claim 1, wherein the width in the circumferential direction of each of the plurality of slits increases toward the center of the lower ring.

7. A semiconductor manufacturing apparatus comprising a plasma confinement ring, wherein the plasma confinement ring comprises:
a lower ring providing a lower center hole and having a circular plate shape;
an upper ring providing an upper center hole and having the circular plate shape; and
a connection ring downwardly extended from the upper ring toward the lower ring to connect the lower ring to the upper ring,
wherein the lower ring comprises:
a lower connection member providing the lower center hole; and
a lower body placed outside the lower connection member to provide a plurality of slits extended in a direction from the lower center hole to a circumference of the lower ring,
wherein a thickness of each of the plurality of slits at a first position, which is spaced apart from a center axis of the lower ring by a first distance, is smaller than a thickness of each of the plurality of slits at a second position, which is spaced apart from the center axis of the lower ring by a second distance greater than the first distance,
wherein, at the first position, a ratio of a width of each of the plurality of slits in a circumferential direction to the thickness of each of the plurality of slits ranges from 0.37 to 1.5,
wherein a thickness of the lower ring linearly increases in a continuous, non-stepwise manner, from the first position to the second position,
wherein each of the plurality of slits has a constant width toward a center of the lower ring, and wherein a length of each of the plurality of slits in a radial direction of the lower ring is greater than a half of a length of the lower ring in the radial direction of the lower ring.

8. The semiconductor manufacturing apparatus of claim 7, wherein the width of each of the plurality of slits at the first position ranges from 2.3 mm to 2.7 mm, and wherein the thickness of each of the plurality of slits at the first position ranges from 3.0 mm to 5.0 mm.

9. The semiconductor manufacturing apparatus of claim 7, wherein a vertical distance between a top surface of the lower ring and a bottom surface of the upper ring at the first position ranges from 0.5 mm to 5 mm.

10. The semiconductor manufacturing apparatus of claim 7, wherein widths of the plurality of slits are same or substantially same in an entire region across the lower ring.

11. The semiconductor manufacturing apparatus of claim 7, wherein the lower ring is coupled to the connection ring in a manner detachable from the connection ring.

12. The semiconductor manufacturing apparatus of claim 7, wherein a thickness of the lower ring is smaller at the first position than at the second position.

13. A plasma confinement ring comprising: a lower ring; an upper ring on the lower ring; and a connection ring extended to connect the lower ring to the upper ring, wherein the lower ring is provided to have a lower center hole vertically penetrating the lower ring at a center of the lower ring, wherein the lower ring comprises a plurality of slits penetrating the lower ring in a region outside the lower center hole, wherein a thickness of the lower ring is smaller at a first region closer to the lower center hole than a second region farther from the lower center hole, wherein the first region of the lower ring is included in a variable region of the lower ring of which a thickness linearly decreases, in a continuous, non-stepwise manner, toward the center of the lower ring, and the second region of the lower ring is included in a non-variable region of the lower ring of which a thickness is constant toward the center of the lower ring, wherein each of the plurality of slits has a width increasing toward the center of the lower ring wherein the width of each of the plurality of slits is measured in a circumferential direction of the lower ring, wherein the plurality of slits are spaced apart from each other in the circumferential direction of the lower ring, and wherein, at a first position spaced apart from a center axis of the lower ring by a first distance, a ratio of the width of each of the plurality of slits to a thickness of each of the plurality of slits ranges from 0.37 to 1.5.

14. The plasma confinement ring of claim 13, wherein a ratio of the width to the thickness of each of the plurality of slits at the first position is greater than a ratio of the width to the thickness of each of the plurality of slits at a second position spaced apart from the center axis of the lower ring by a second distance greater than the first distance.

15. The plasma confinement ring of claim 13, wherein widths of the plurality of slits are same or substantially same in an entire region along the circumferential direction of the lower ring.

* * * * *